(12) United States Patent
Hinoue et al.

(10) Patent No.: US 10,229,931 B1
(45) Date of Patent: Mar. 12, 2019

(54) THREE-DIMENSIONAL MEMORY DEVICE CONTAINING FLUORINE-FREE TUNGSTEN—WORD LINES AND METHODS OF MANUFACTURING THE SAME

(71) Applicant: SANDISK TECHNOLOGIES LLC, Plano, TX (US)

(72) Inventors: Tatsuya Hinoue, Yokkaichi (JP); Tomoyuki Obu, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/831,481

(22) Filed: Dec. 5, 2017

(51) Int. Cl.
| | |
|---|---|
| H01L 27/115 | (2017.01) |
| G11C 16/08 | (2006.01) |
| G11C 16/04 | (2006.01) |
| H01L 29/423 | (2006.01) |
| H01L 27/11582 | (2017.01) |
| H01L 27/11565 | (2017.01) |
| H01L 27/11529 | (2017.01) |

(52) U.S. Cl.
CPC .... *H01L 27/11582* (2013.01); *G11C 16/0483* (2013.01); *H01L 27/11529* (2013.01); *H01L 27/11565* (2013.01); *H01L 29/42344* (2013.01); *H01L 2924/01074* (2013.01)

(58) Field of Classification Search
None
See application file for complete search history.

(56) References Cited

U.S. PATENT DOCUMENTS

| | | | |
|---|---|---|---|
| 5,084,417 | A | 1/1992 | Joshi et al. |
| 5,807,788 | A | 9/1998 | Brodsky et al. |
| 5,915,167 | A | 6/1999 | Leedy |
| 6,958,265 | B2 | 10/2005 | Steimle et al. |
| 7,067,871 | B2 | 6/2006 | Ozawa |
| 7,071,108 | B2 | 7/2006 | Matsui et al. |
| 7,177,191 | B2 | 2/2007 | Fasoli et al. |

(Continued)

FOREIGN PATENT DOCUMENTS

WO    WO2002/015277 A2    2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Joseph Schoenholtz
(74) *Attorney, Agent, or Firm* — The Marbury Law Group PLLC

(57) ABSTRACT

A method of forming a three-dimensional memory device includes forming an alternating stack of insulating layers and sacrificial material layers over a substrate, forming memory stack structures through the alternating stack, such that each of the memory stack structures includes a memory film and a vertical semiconductor channel, forming backside recesses by removing the sacrificial material layers selective to the insulating layers and the memory stack structures, forming a backside blocking dielectric layer in the backside recesses, forming an amorphous titanium oxide layer on surfaces of the backside blocking dielectric layer in the backside recesses, and forming tungsten word lines in the backside recesses using a fluorine-free tungsten-containing precursor gas.

18 Claims, 26 Drawing Sheets

(56) References Cited

U.S. PATENT DOCUMENTS

| | | | |
|---|---|---|---|
| 7,221,588 B2 | 5/2007 | Fasoli et al. | |
| 7,232,764 B1 | 6/2007 | Yaegashi | |
| 7,233,522 B2 | 6/2007 | Chen et al. | |
| 7,378,353 B2 | 5/2008 | Lee et al. | |
| 7,485,961 B2 | 2/2009 | Doan et al. | |
| 7,514,321 B2 | 4/2009 | Mokhlesi et al. | |
| 7,531,862 B2 | 5/2009 | Fujimori | |
| 7,547,951 B2 | 6/2009 | Lim et al. | |
| 7,575,973 B2 | 8/2009 | Mokhlesi et al. | |
| 7,598,557 B2 | 10/2009 | Sashida et al. | |
| 7,608,195 B2 | 10/2009 | Wilson | |
| 7,648,872 B2 | 1/2010 | Benson | |
| 7,745,265 B2 | 6/2010 | Mokhlesi et al. | |
| 7,745,312 B2 | 6/2010 | Herner et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 7,969,008 B2 | 6/2011 | Nagai | |
| 8,008,710 B2 | 8/2011 | Fukuzumi | |
| 8,053,829 B2 | 11/2011 | Kang et al. | |
| 8,093,725 B2 | 1/2012 | Wilson | |
| 8,187,936 B2 | 5/2012 | Alsmeier et al. | |
| 8,193,054 B2 | 6/2012 | Alsmeier | |
| 8,193,074 B2 | 6/2012 | Tanaka | |
| 8,198,672 B2 | 6/2012 | Alsmeier | |
| 8,222,160 B2 | 7/2012 | Uozumi | |
| 8,283,228 B2 | 10/2012 | Alsmeier | |
| 8,349,681 B2 | 1/2013 | Alsmeier et al. | |
| 8,446,003 B2 | 5/2013 | Komura et al. | |
| 8,767,439 B2 | 7/2014 | Terai | |
| 8,828,814 B2 | 9/2014 | Wang et al. | |
| 8,884,357 B2 | 11/2014 | Wang et al. | |
| 8,987,087 B2 | 3/2015 | Chien et al. | |
| 8,987,089 B1 | 3/2015 | Pachamuthu et al. | |
| 9,023,719 B2 | 5/2015 | Pachamuthu et al. | |
| 9,153,486 B2 | 10/2015 | Arghavani et al. | |
| 9,230,973 B2 | 1/2016 | Pachamuthu et al. | |
| 9,252,151 B2 | 2/2016 | Chien et al. | |
| 9,397,046 B1* | 7/2016 | Sharangpani | H01L 27/1157 |
| 9,397,093 B2 | 7/2016 | Makala et al. | |
| 9,406,694 B1 | 8/2016 | Ikeno et al. | |
| 9,449,983 B2 | 9/2016 | Yada et al. | |
| 9,460,931 B2 | 10/2016 | Pachamuthu et al. | |
| 9,698,152 B2 | 7/2017 | Peri et al. | |
| 9,748,174 B1 | 8/2017 | Amano | |
| 9,793,139 B2 | 10/2017 | Sharangpani et al. | |
| 9,799,671 B2 | 10/2017 | Pachamuthu et al. | |
| 2002/0190379 A1 | 12/2002 | Jian et al. | |
| 2004/0159874 A1 | 8/2004 | Tsuchiya et al. | |
| 2006/0102586 A1 | 5/2006 | Lee et al. | |
| 2007/0023917 A1 | 2/2007 | Yamada | |
| 2007/0210338 A1 | 9/2007 | Orlowski | |
| 2007/0252201 A1 | 11/2007 | Kito et al. | |
| 2009/0227105 A1 | 9/2009 | Fu et al. | |
| 2009/0267132 A1 | 10/2009 | Cha et al. | |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho | |
| 2010/0181610 A1 | 7/2010 | Kim et al. | |
| 2010/0187584 A1 | 7/2010 | Matsuda | |
| 2010/0207195 A1 | 8/2010 | Fukuzumi et al. | |
| 2010/0320528 A1 | 12/2010 | Jeong et al. | |
| 2011/0076819 A1 | 3/2011 | Kim et al. | |
| 2011/0133606 A1 | 6/2011 | Yoshida et al. | |
| 2011/0266606 A1 | 11/2011 | Park et al. | |
| 2012/0001247 A1 | 1/2012 | Alsmeier | |
| 2012/0001249 A1 | 1/2012 | Alsmeier | |
| 2012/0012921 A1 | 1/2012 | Liu | |
| 2012/0070944 A1 | 3/2012 | Kim et al. | |
| 2012/0256247 A1 | 10/2012 | Alsmeier | |
| 2013/0122712 A1 | 5/2013 | Kim et al. | |
| 2013/0224960 A1 | 8/2013 | Payyapilly et al. | |
| 2013/0248974 A1 | 9/2013 | Alsmeier et al. | |
| 2013/0264631 A1 | 10/2013 | Alsmeier et al. | |
| 2013/0270631 A1 | 10/2013 | Kim et al. | |
| 2013/0313627 A1 | 11/2013 | Lee et al. | |
| 2014/0008714 A1 | 1/2014 | Makala et al. | |
| 2014/0353738 A1 | 12/2014 | Makala et al. | |
| 2015/0037912 A1 | 2/2015 | Sakata | |
| 2015/0076585 A1 | 3/2015 | Pachamuthu et al. | |
| 2015/0380419 A1 | 12/2015 | Gunji-Yoneoka et al. | |
| 2016/0133512 A1 | 5/2016 | Lee et al. | |
| 2016/0148945 A1 | 5/2016 | Sharangpani et al. | |
| 2016/0149002 A1 | 5/2016 | Sharangpani et al. | |
| 2016/0149049 A1 | 5/2016 | Sharangpani et al. | |
| 2016/0163870 A1 | 6/2016 | Ito et al. | |
| 2016/0300848 A1 | 10/2016 | Pachamuthu et al. | |
| 2016/0307908 A1* | 10/2016 | Sharangpani | H01L 27/1157 |
| 2017/0125538 A1 | 5/2017 | Sharangpani et al. | |
| 2017/0243873 A1 | 8/2017 | Kobayashi et al. | |
| 2017/0352559 A1* | 12/2017 | Liu | H01L 23/485 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, dated Jan. 17, 2012.

Invitation to Pay Additional Fees & Partial International Search Report, PCT/US2011/042566, dated Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

Y.S. Kim et al., "Direct Copper Electroless Deposition on a Tungsten Barrier Layer for Ultralarge Scale Integration," Journal of the Electrochemical Society, vol. 152 (2) 2005.

Y. Au et al., "Filling Narrow Trenches by Iodine-Catalyzed CVD of Copper and Manganese on Manganese Nitride Barrier/Adhesion Layers," Journal of the Electrochemical Society, vol. 158 (5) 2011.

K. R. Williams et al., "Etch Rates for Micromachining Processing," Journal of Microelectromechanical Systems, vol. 5, No. 4, Dec. 1996.

K. R. Williams et al., "Etch Rates for Micromachining Processing Part II," Journal of the Microelectromechanical Systems, vol. 12, No. 6, Dec. 2003.

M. Claes et al., "Selective Wet Etching of Hf-based Layers," Abstracts, 204th Meeting of the Electrochemical Society, 2003.

Non-final Office Action for U.S. Appl. No. 15/291,640, dated Sep. 8, 2017, 27 pages.

(56) References Cited

OTHER PUBLICATIONS

Invitation to Pay Additional Fees from the International Searching Authority for International Patent Application No. PCT/US2017/029363, dated Jul. 19, 2017, 13 pages.

International Search Report and Written Opinion of the International Searching Authority for International Patent Application No. PCT/US2017/029363, dated Sep. 11, 2017, 18 pages.

U.S. Appl. No. 15/291,640, filed Oct. 12, 2016, SanDisk Technologies.

U.S. Appl. No. 15/483,862, filed Apr. 10, 2017, SanDisk Technologies.

U.S. Appl. No. 15/804,692, filed Nov. 6, 2017, SanDisk Technologies.

* cited by examiner

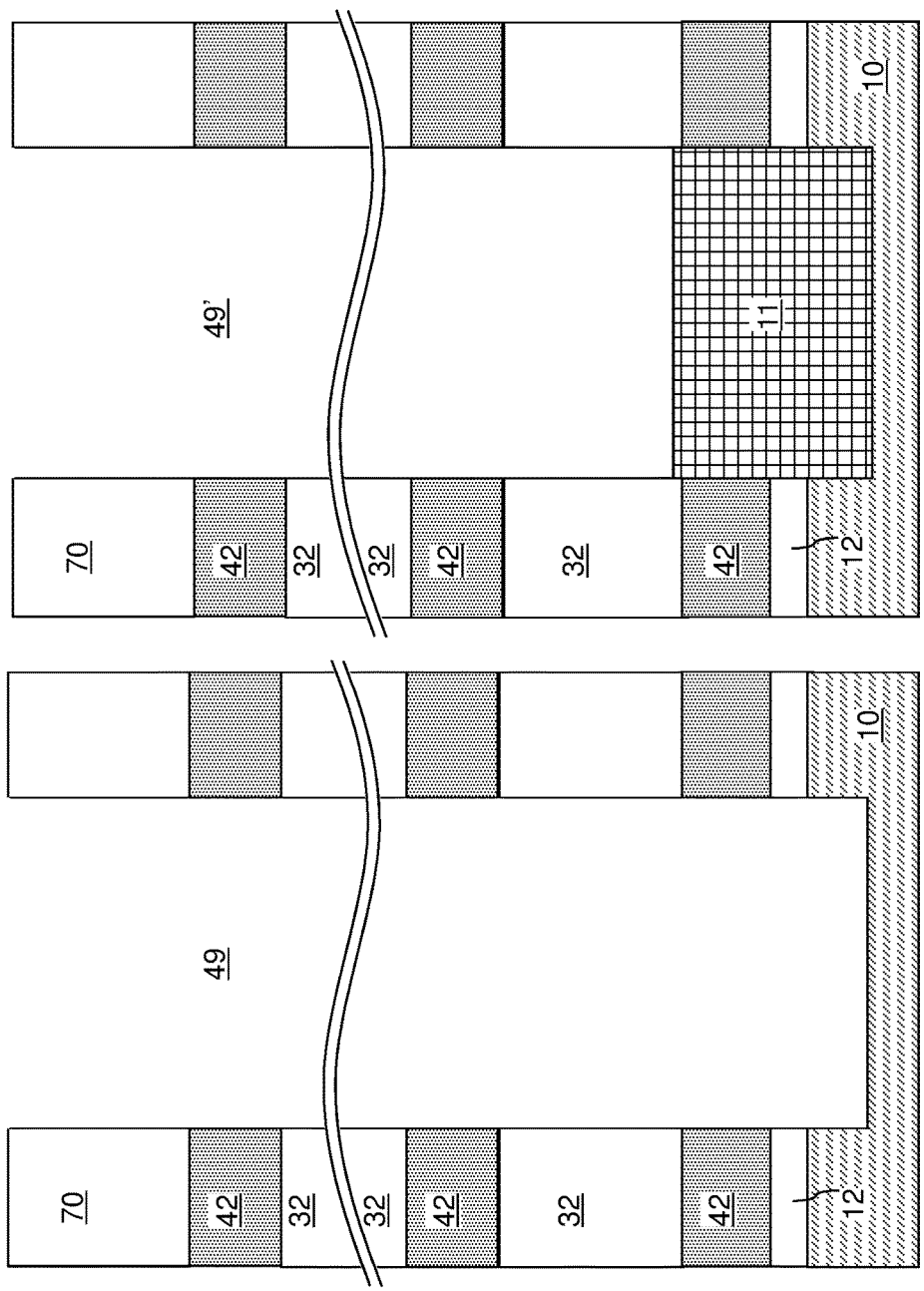

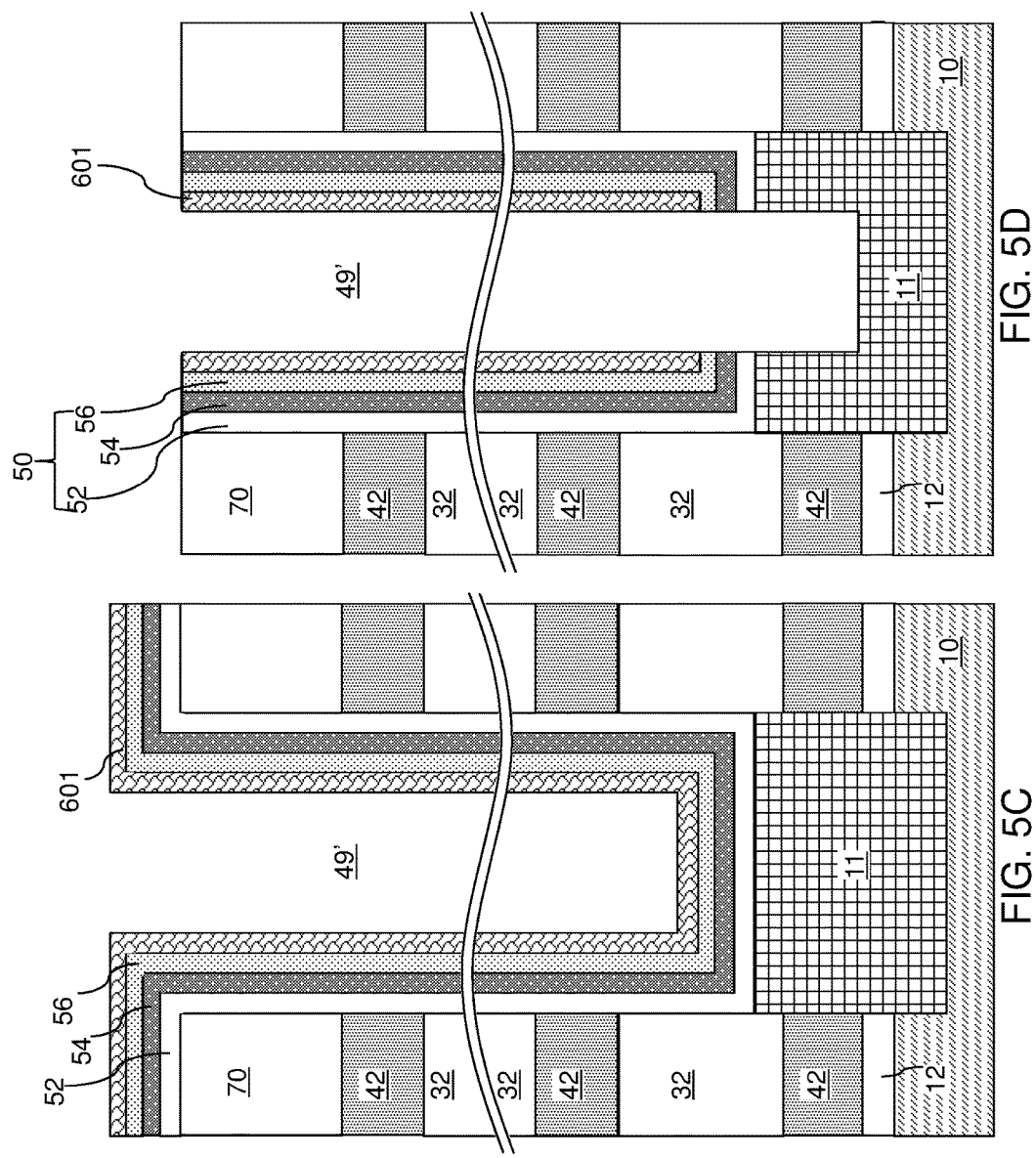

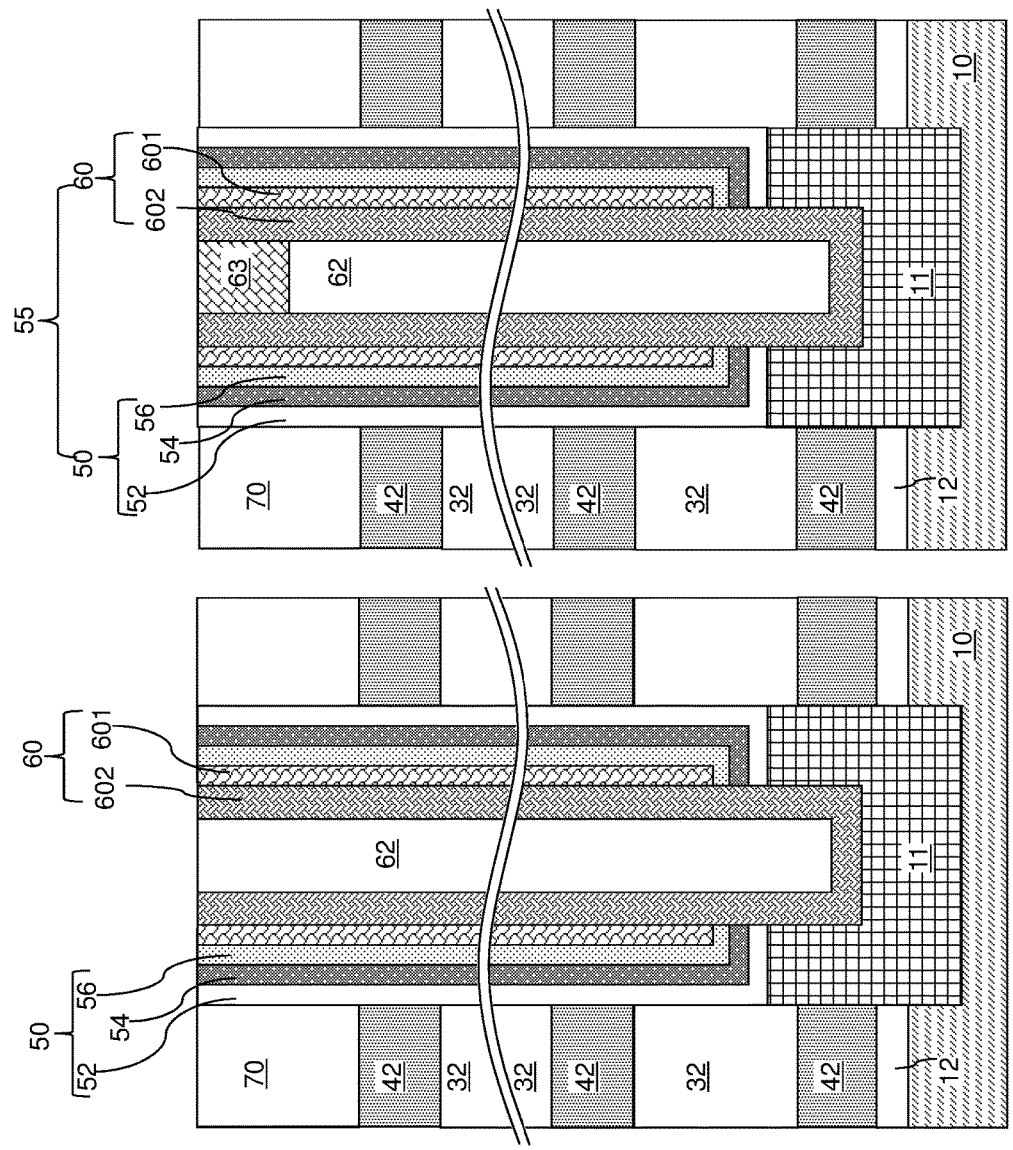

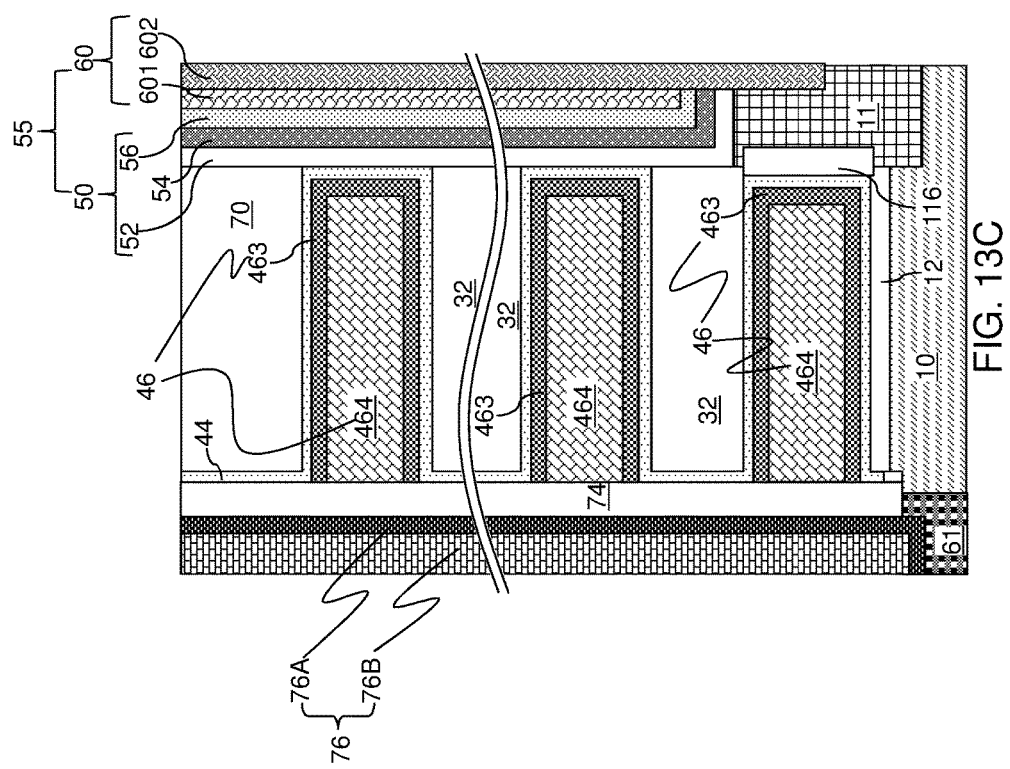

US 10,229,931 B1

THREE-DIMENSIONAL MEMORY DEVICE CONTAINING FLUORINE-FREE TUNGSTEN—WORD LINES AND METHODS OF MANUFACTURING THE SAME

FIELD

The present disclosure relates generally to the field of semiconductor devices and specifically to three-dimensional semiconductor devices including fluorine-free tungsten-containing word lines and methods of making the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

Fluorine diffusion between word lines and insulating layers in an alternating stack of layers of a three-dimensional memory device can adversely impact reliability of the three-dimensional memory device by forming voids in the insulating layers, causing migration of materials, and forming electrical shorts.

SUMMARY

According to an aspect of the present disclosure, a method of forming a three-dimensional memory device includes forming an alternating stack of insulating layers and sacrificial material layers over a substrate, forming memory stack structures through the alternating stack, such that each of the memory stack structures includes a memory film and a vertical semiconductor channel, forming backside recesses by removing the sacrificial material layers selective to the insulating layers and the memory stack structures, forming a backside blocking dielectric layer in the backside recesses, forming an amorphous titanium oxide layer on surfaces of the backside blocking dielectric layer in the backside recesses, and forming tungsten word lines in the backside recesses using a fluorine-free tungsten-containing precursor gas.

According to another aspect of the present disclosure, a three-dimensional memory device includes an alternating stack of insulating layers and electrically conductive layers located over a substrate, memory stack structures extending through the alternating stack, wherein each of the memory stack structures comprises a memory film and a vertical semiconductor channel, and a backside blocking dielectric layer is located between each vertically neighboring pair of an insulating layer and an electrically conductive layer. Each of the electrically conductive layers comprises a fluorine-free tungsten material portion in contact with surfaces of the backside blocking dielectric layer.

BRIEF DESCRIPTION OF THE DRAWINGS

FIGS. 5A-5H are sequential schematic vertical cross-sectional views of a memory opening within the exemplary structure during various processing steps employed to form a memory stack structure according to an embodiment of the present disclosure.

FIG. 13C is a magnified view of a region of the exemplary structure of FIG. 13A according to the second embodiment of the present disclosure.

DETAILED DESCRIPTION

Figure 1:
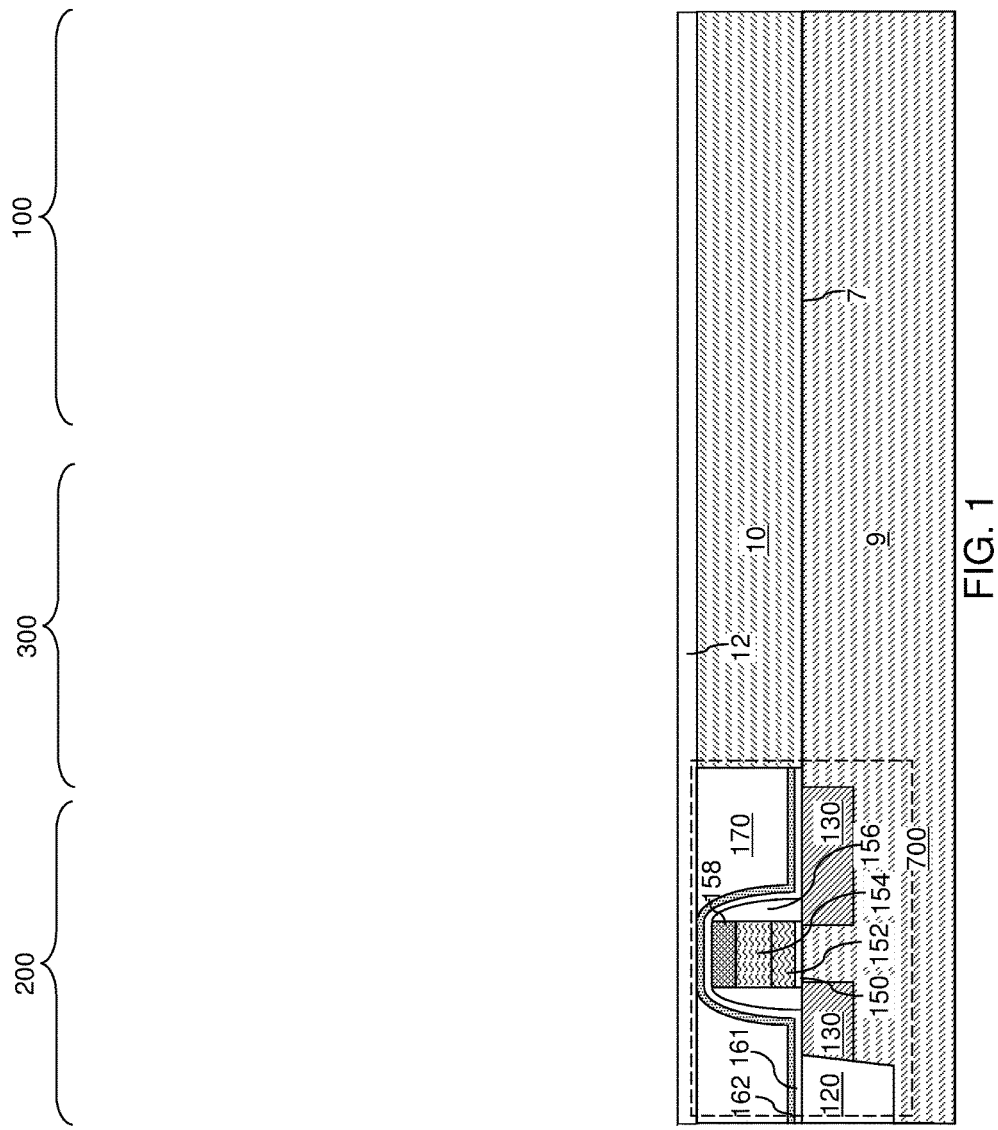
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to three-dimensional semiconductor devices including fluorine-free tungsten-containing word lines and methods of making the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

The various embodiments of the present disclosure can be employed to provide a metallic barrier layer that effectively suppresses fluorine diffusion between electrically conductive layers and insulating layers in a three-dimensional memory device.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from $1.0$ S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Optionally, a base insulating layer 12 can be formed above the semiconductor material layer 10 and the planarization dielectric layer 170. The base insulating layer 12 can be, for example, silicon oxide layer. The thickness of the base insulating layer 12 can be in a range from 3 nm to 30 nm, although lesser and greater thicknesses can also be employed.

Figure 2:
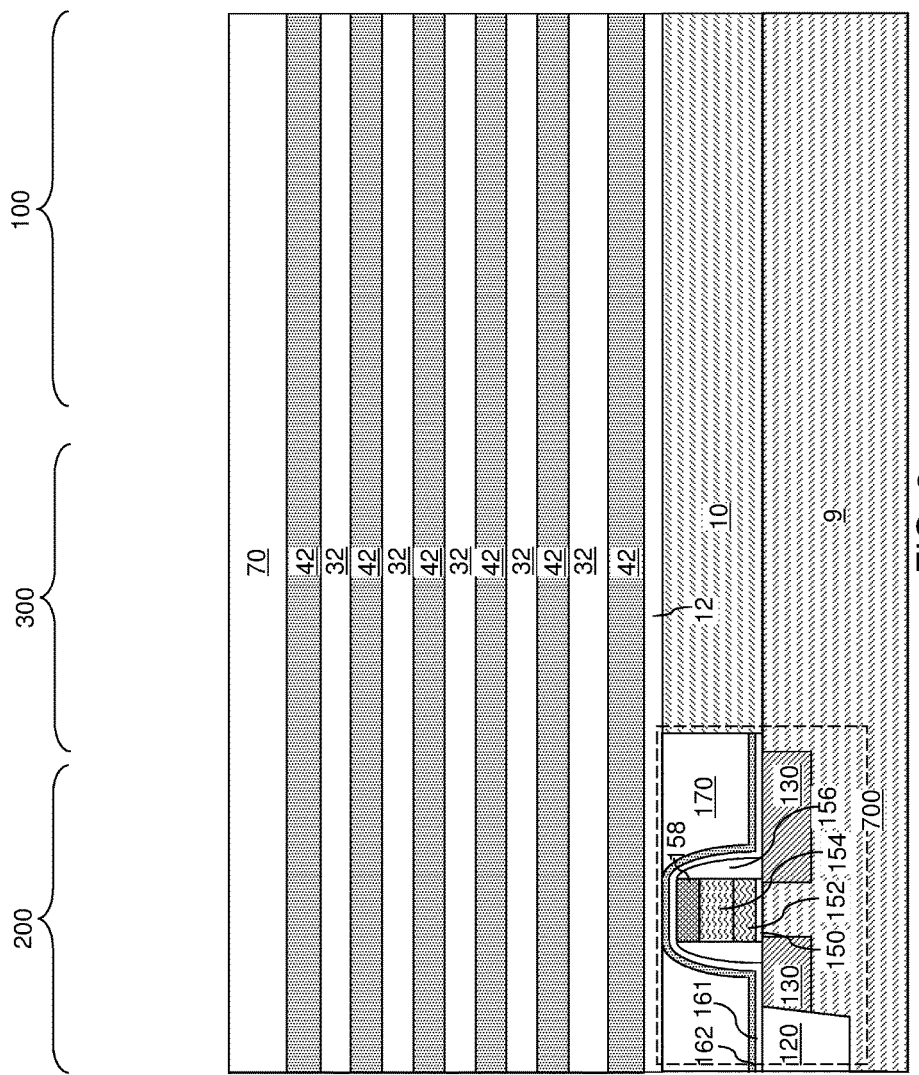
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate, which can be, for example, on the top surface of the base insulating layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
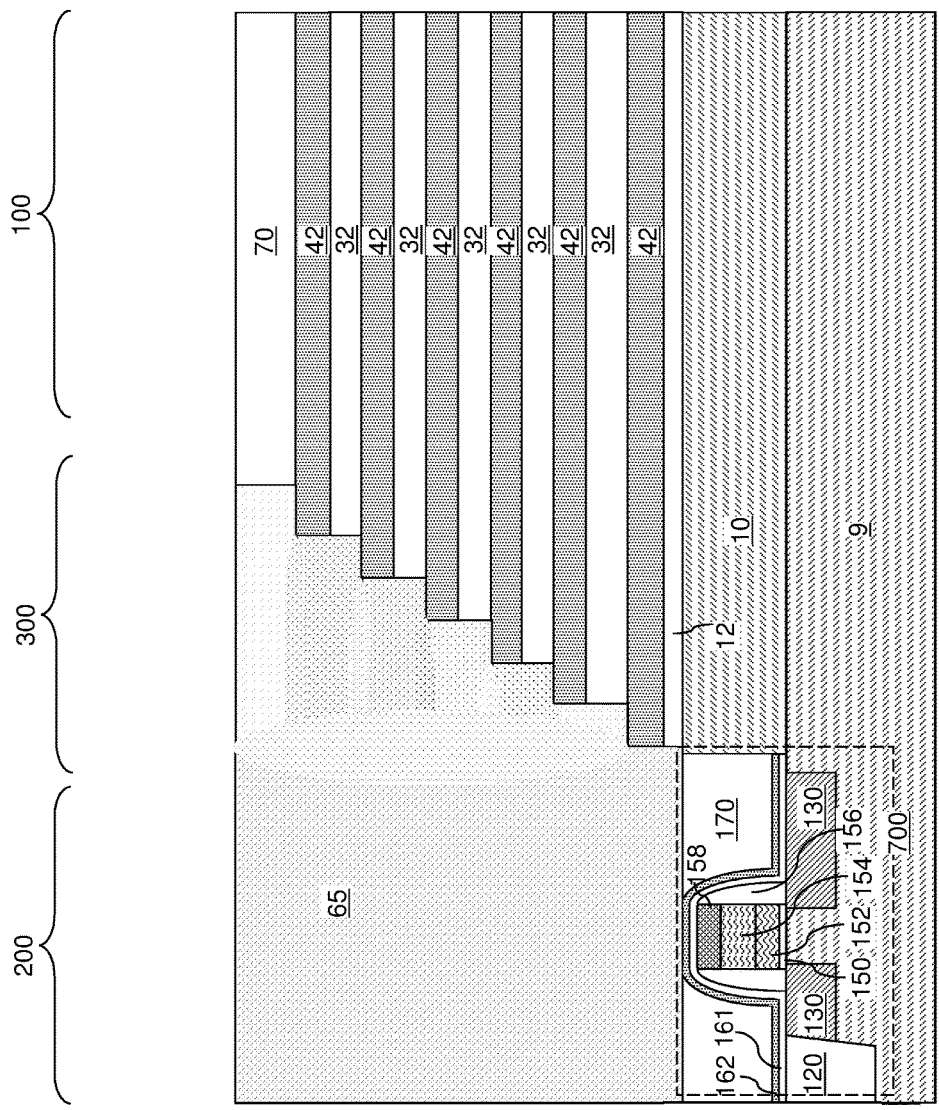
FIG. 3 is a schematic vertical cross-sectional view of the exemplary structure after formation of stepped terraces and a retro-stepped dielectric material portion according to an embodiment of the present disclosure.

Referring to FIG. 3, a stepped cavity can be formed within the contact region 300 which is located between the memory array region (e.g., device region) 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4A:
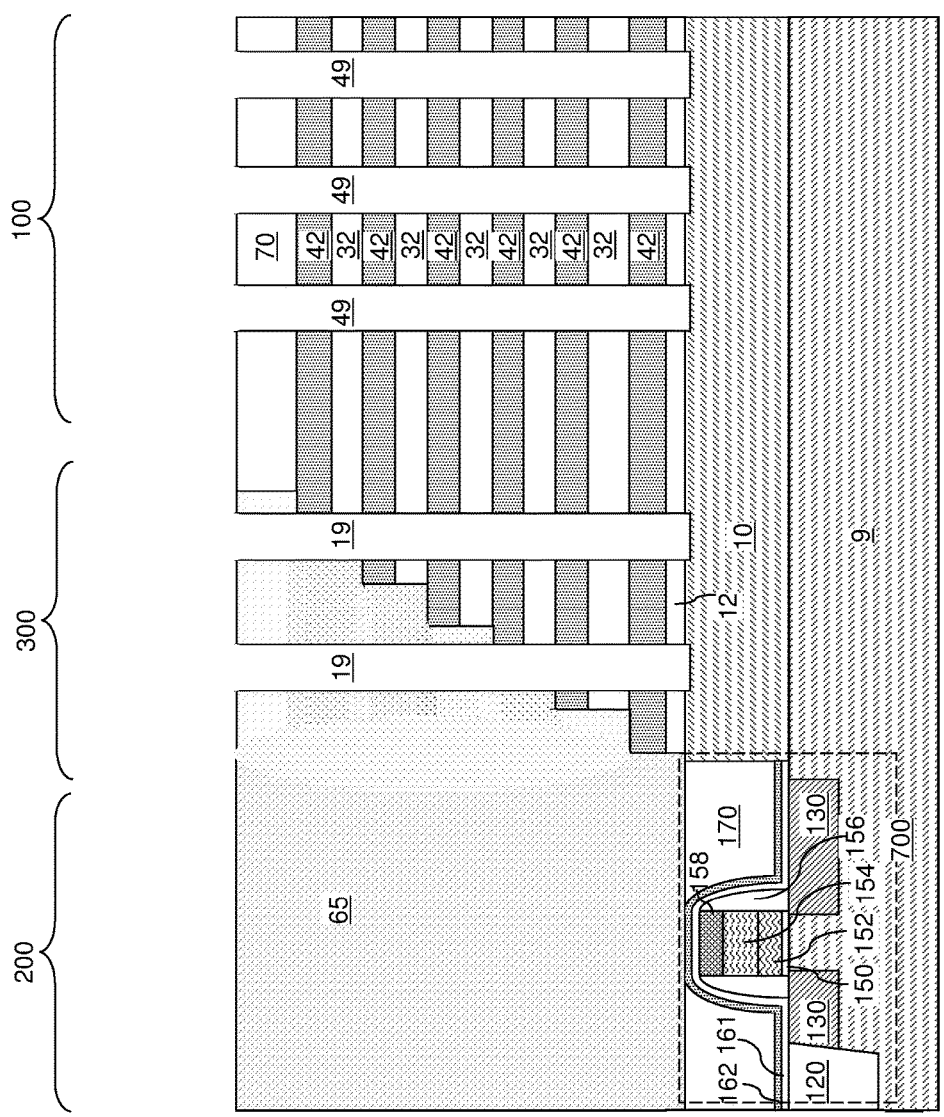
FIG. 4A is a schematic vertical cross-sectional view of the exemplary structure after formation of memory openings according to an embodiment of the present disclosure.
Figure 4B:
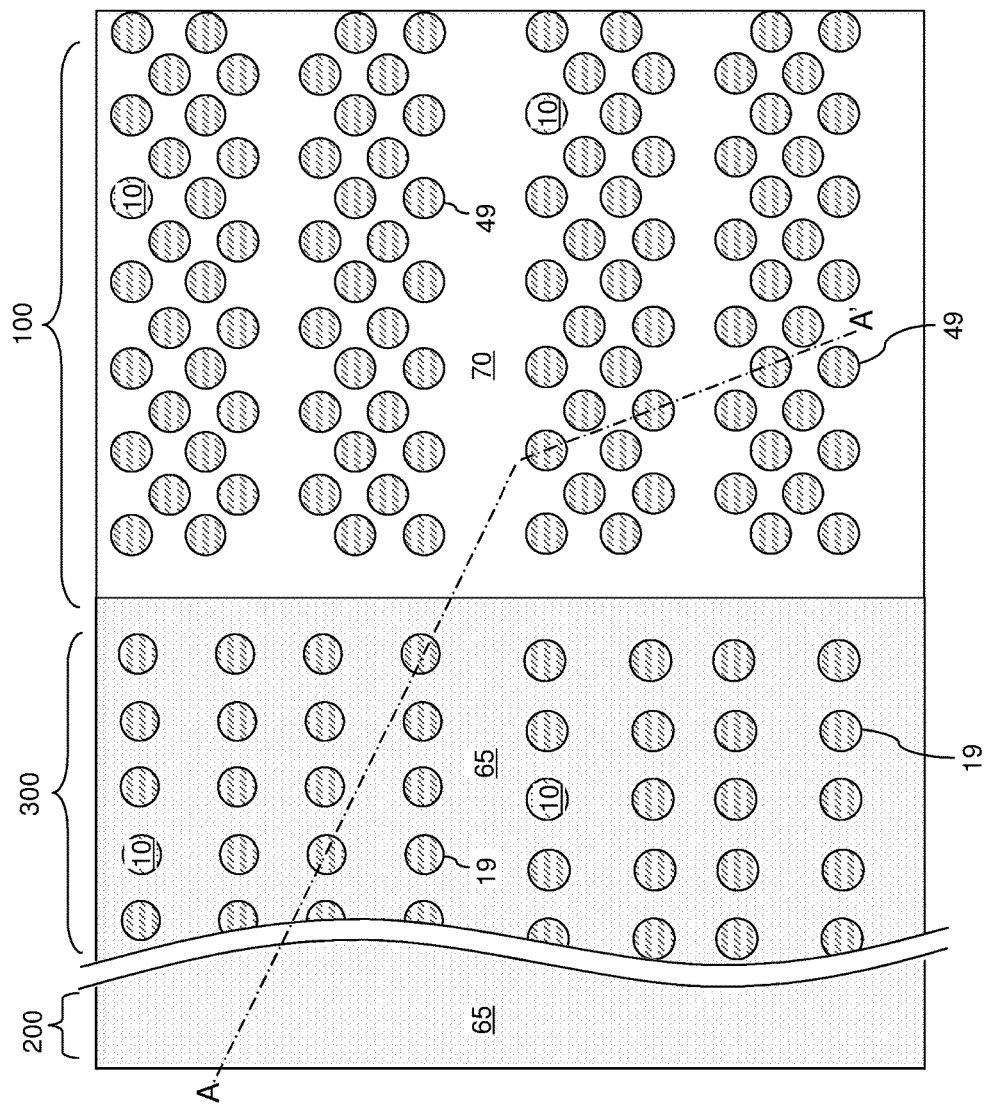
FIG. 4B is a top-down view of the exemplary structure of FIG. 4A. The vertical plane A-A' is the plane of the schematic vertical cross-sectional view of FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can be formed through the base insulating layer 12 so that the memory openings 49 and the support openings 19 extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIG. 4 is illustrated. The memory opening 49 extends through the insulating cap layer 70, the alternating stack (32, 42), the base insulating layer 12, and optionally into an upper portion of the semiconductor material layer 10. At this processing step, each support opening 19 can extend through the retro-stepped dielectric material portion 65, a subset of layers in the alternating stack (32, 42), the base insulating layer 12, and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional epitaxial channel portion (e.g., an epitaxial pedestal) 11 can be formed at the bottom portion of each memory opening 49 and each support openings 19, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer. The epitaxial channel portion 11 can be a portion of a transistor channel that extends between a source region to be subsequently formed in the substrate (9, 10) and a drain region to be subsequently formed in an upper portion of the memory opening 49. A cavity 49' is present in the unfilled portion of the memory opening 49 above the epitaxial channel portion 11 as well as in the support opening 19. In one embodiment, the epitaxial channel portion 11 can comprise single crystalline silicon. In one embodiment, the epitaxial channel portion 11 can have a doping of the first conductivity type, which is the same as the conductivity type of the semiconductor material layer 10 that the epitaxial channel portion 11 contacts. If a semiconductor material layer 10 is not present, the epitaxial channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49 and the support opening 19.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by anisotropic etch process.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the epitaxial channel portion 11 (or a surface of the semiconductor substrate layer 10 in case the epitaxial channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 10 in case epitaxial channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 5E:
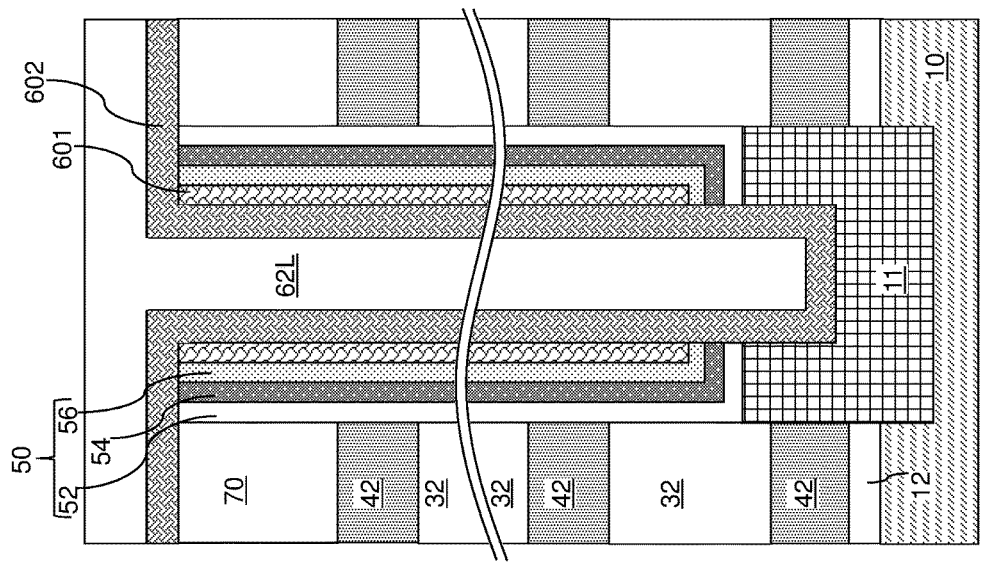

Referring to FIG. 5E, a second semiconductor channel layer 602 can be deposited directly on the semiconductor surface of the epitaxial channel portion 11 or the semiconductor substrate layer 10 if portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Figure 5F:
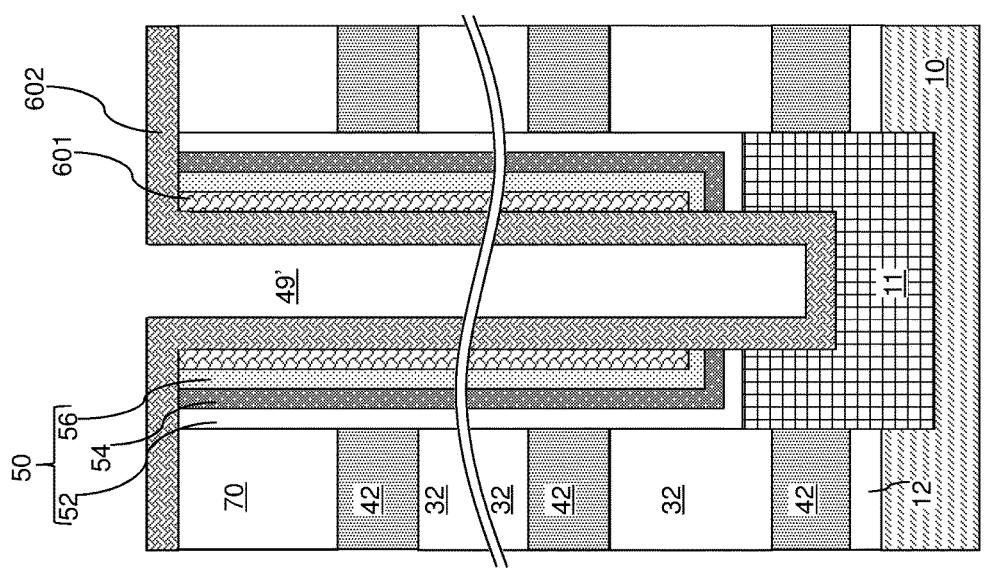

Referring to FIG. 5F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of an epitaxial channel portion 11 (if present), a memory stack structure 55, a dielectric core 62, and a drain region 63 within a memory opening 49 is herein referred to as a memory opening fill structure (11, 55, 62, 63). Each combination of an epitaxial channel portion 11 (if present), a memory film 50, a vertical semiconductor channel 60, a dielectric core 62, and a drain region 63 within each support opening 19 fills the respective support openings 19, and constitutes a support pillar structure 20 as illustrated in FIG. 6.

Figure 6:
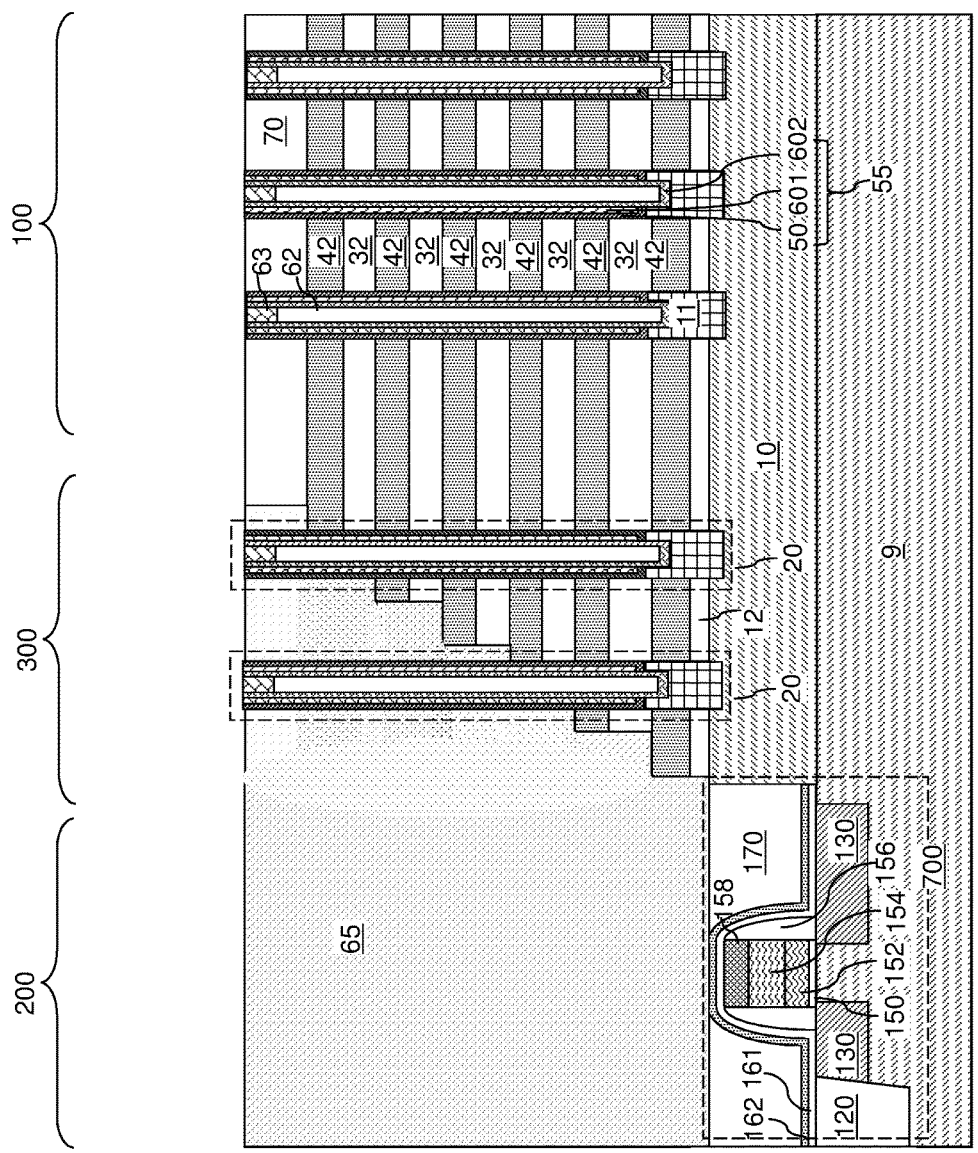
FIG. 6 is a schematic vertical cross-sectional view of the exemplary structure after formation of memory stack structures according to an embodiment of the present disclosure.

Referring to FIG. 6, the exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 4A and 4B. An instance of the support pillar structure 20 can be formed within each support opening 19 of the structure of FIGS. 4A and 4B.

Each exemplary memory stack structure 55 includes a vertical semiconductor channel 60 which may comprise multiple semiconductor channel layers (601, 602) and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
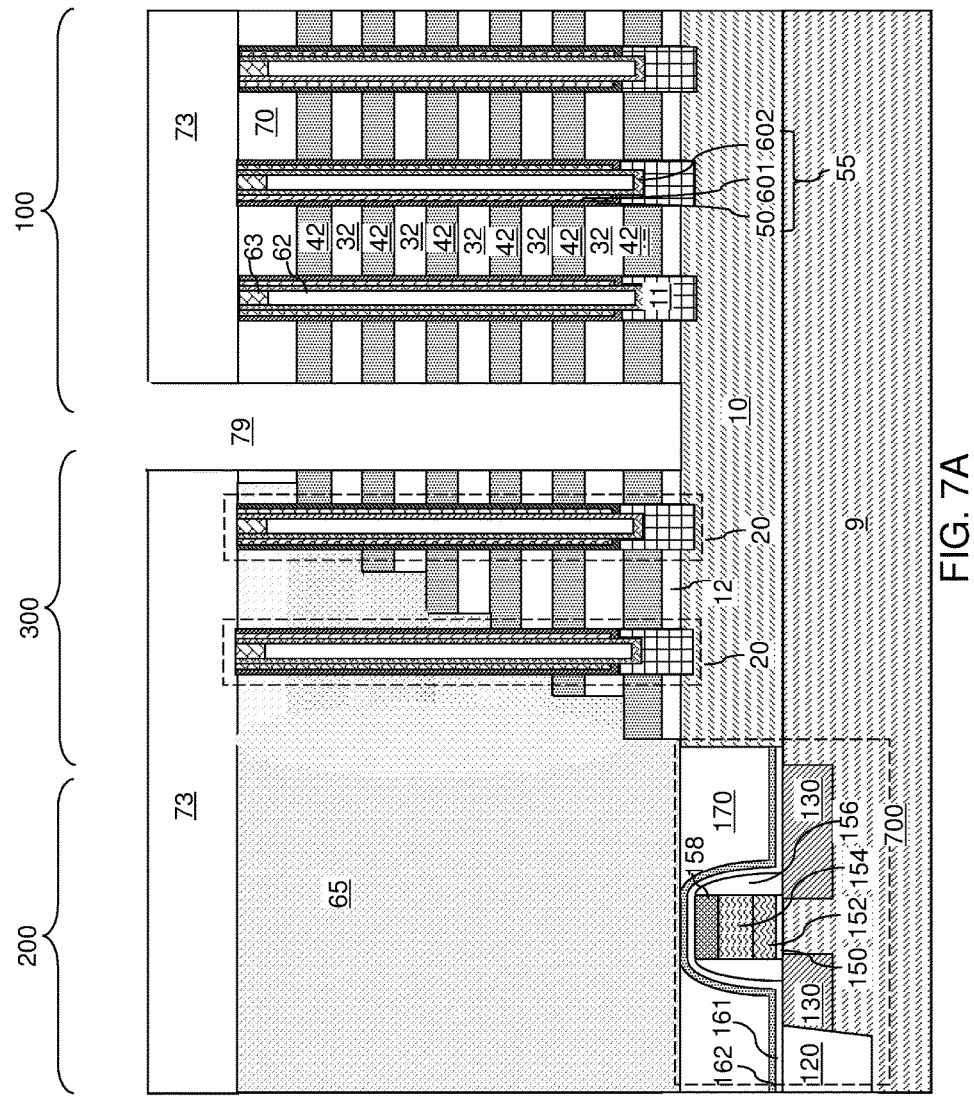
FIG. 7A is a schematic vertical cross-sectional view of the exemplary structure after formation of backside trenches according to an embodiment of the present disclosure.
Figure 7B:
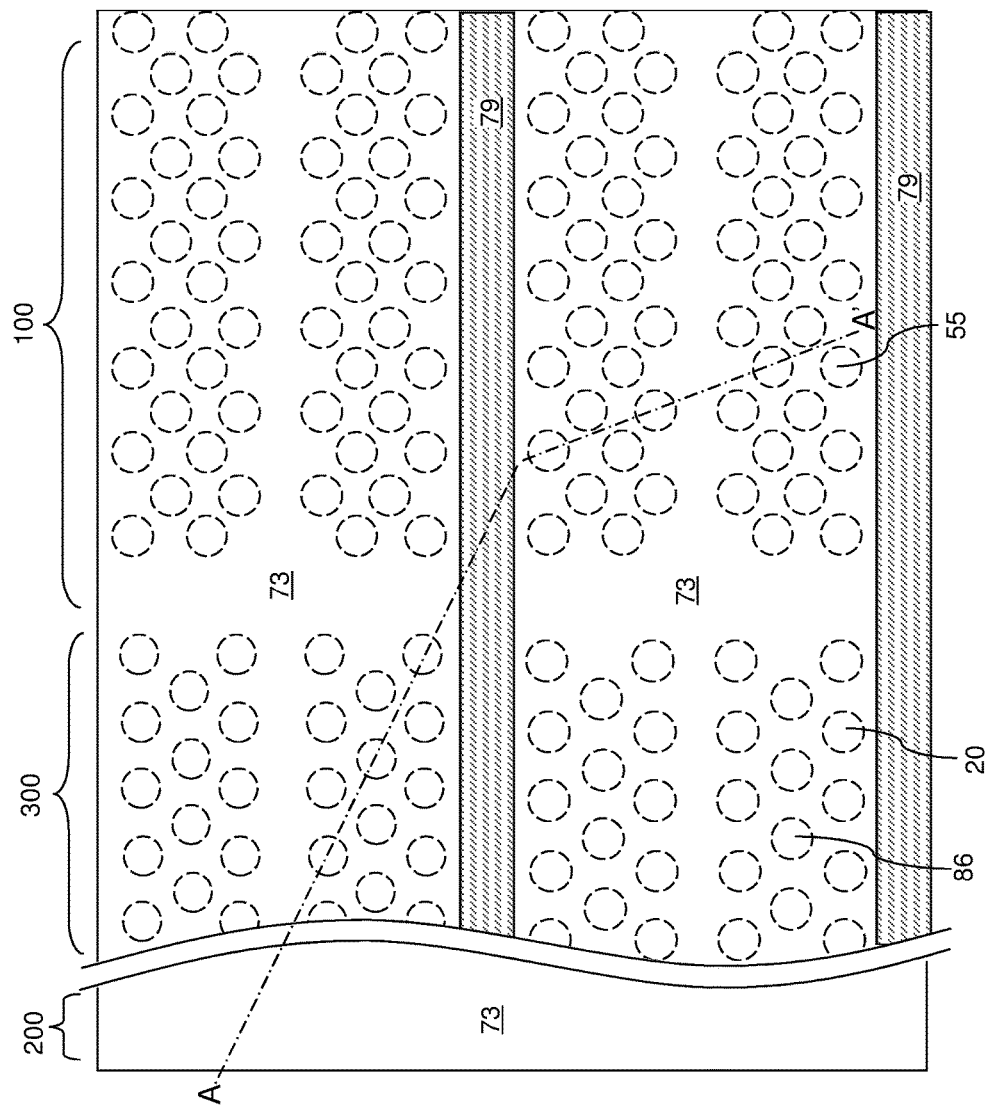
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the alternating stack (32, 42), and is lithographically patterned to form openings in areas between clusters of memory stack structures 55. The pattern in the photoresist layer can be transferred through the alternating stack (32, 42) and/or the retro-stepped dielectric material portion 65 employing an anisotropic etch to form the backside trenches 79, which vertically extend at least to the top surface of the substrate (9, 10), and laterally extend through the memory array region 100 and the contact region 300. In one embodiment, the backside trenches 79 can include a source contact opening in which a source contact via structure can be subsequently formed.

Figure 8:
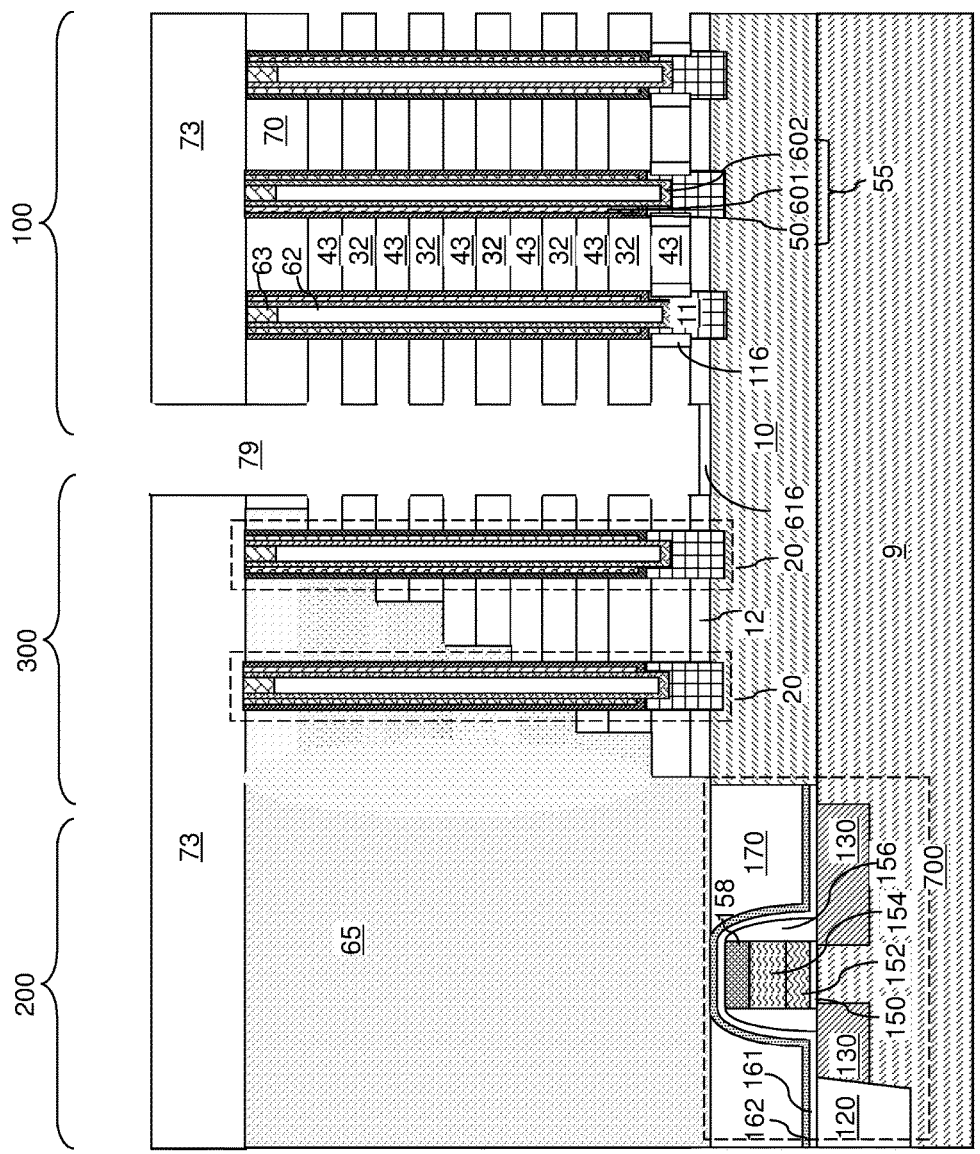
FIG. 8 is a schematic vertical cross-sectional view of the exemplary structure after formation of backside recesses according to an embodiment of the present disclosure.

Referring to FIG. 8, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32 and the retro-stepped dielectric material portion 65 can be selected from silicon oxide, silicon nitride, and dielectric metal oxides. In this case, the depth of the backside trenches 79 can be modified so that the bottommost surface of the backside trenches 79 is located within the base insulating layer 12, i.e., to avoid physical exposure of the top surface of the semiconductor material layer 10.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the epitaxial channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the epitaxial channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

FIGS. 9A-9D illustrate a region of a backside recess 43 during the processing steps employed to form a backside blocking dielectric layer 44 and electrically conductive layer 46.

Figure 9A:
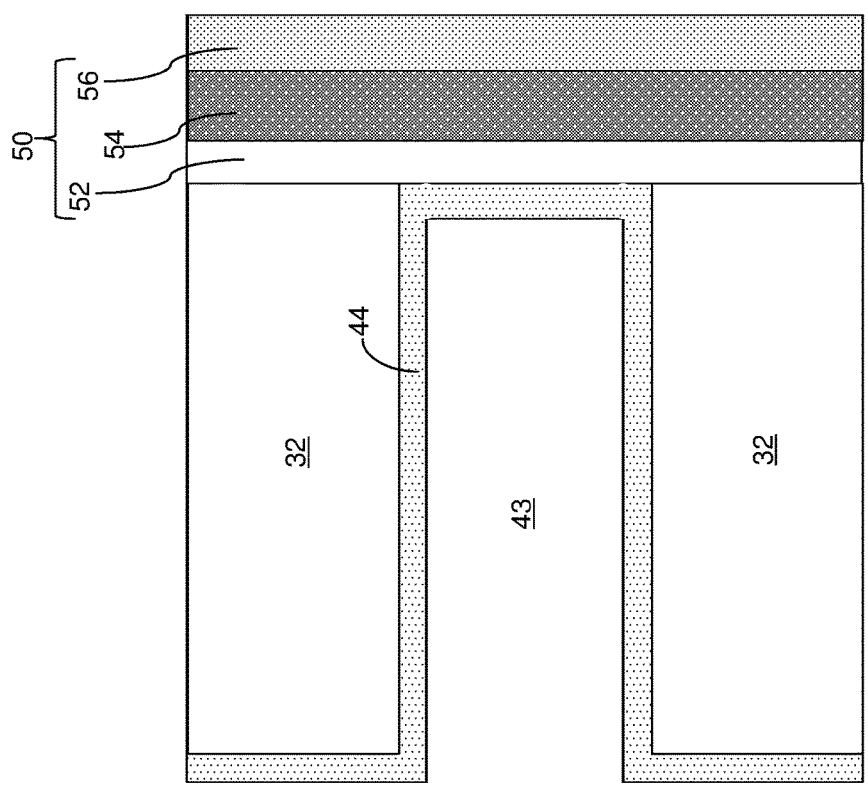
FIGS. 9A-9D are sequential vertical cross-sectional views of a region of the exemplary structure during formation of an electrically conductive layer according to a first embodiment of the present disclosure.

Referring to FIG. 9A, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. In one embodiment, the backside blocking dielectric layer 44 can be formed directly on the outer sidewall of the blocking dielectric layer 52 between each neighboring pairs of insulating layers 32. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. The backside blocking dielectric layer is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figure 9B:
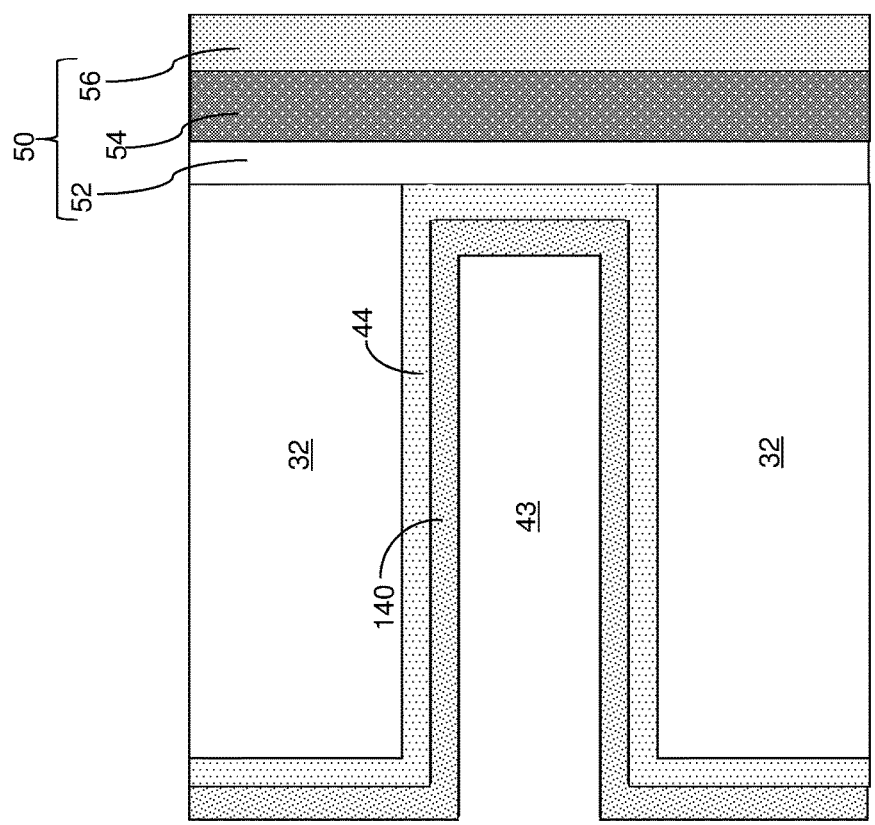

Referring to FIG. 9B, an amorphous titanium oxide layer 140 can be deposited in the backside recesses 43. The amorphous titanium oxide layer 140 can consist essentially of amorphous titanium oxide, and can be deposited by a conformal deposition process such as chemical vapor deposition (CVD) or atomic layer deposition (ALD). The amorphous titanium oxide layer 140 can be formed as a continuous amorphous film that extends from the bottommost insulating layer 32 to the topmost insulating layer 32. The amorphous titanium oxide layer 140 can be formed on all physically exposed surfaces of the backside blocking dielectric layer 44 in the backside recesses 43, around the backside cavities 79', and over the contact level dielectric layer 73. In one embodiment, the amorphous titanium oxide layer 140 can consist essentially of $TiO_x$ such that x is in a range from 1.50 to 2.05, such as x=2. The thickness of the amorphous titanium oxide layer 140 can be in a range from 0.5 nm to 5 nm, such as from 2 nm to 3 nm, although lesser and greater thicknesses can also be employed.

In an illustrative example, an atomic layer deposition process can employ $TiCl_4$ as a titanium-containing precursor gas and $H_2O$ as an oxidant. An inert carrier gas, such as $N_2$, can also be provided. The reactor pressure can be in a range from 20 mTorr to 2 Torr. The deposition temperature can be in a range from 120° C. to 400° C., such as from 120° C. to 400° C. Each deposition cycle can include a $TiCl_4$ pulse period, a first purge period, a $H_2O$ pulse period, and a second purge period. In an embodiment, temperature cycling above 400° C. can be avoided to prevent crystallization of the deposited titanium oxide material so that the amorphous titanium oxide layer 140 remains amorphous.

Figure 9C:
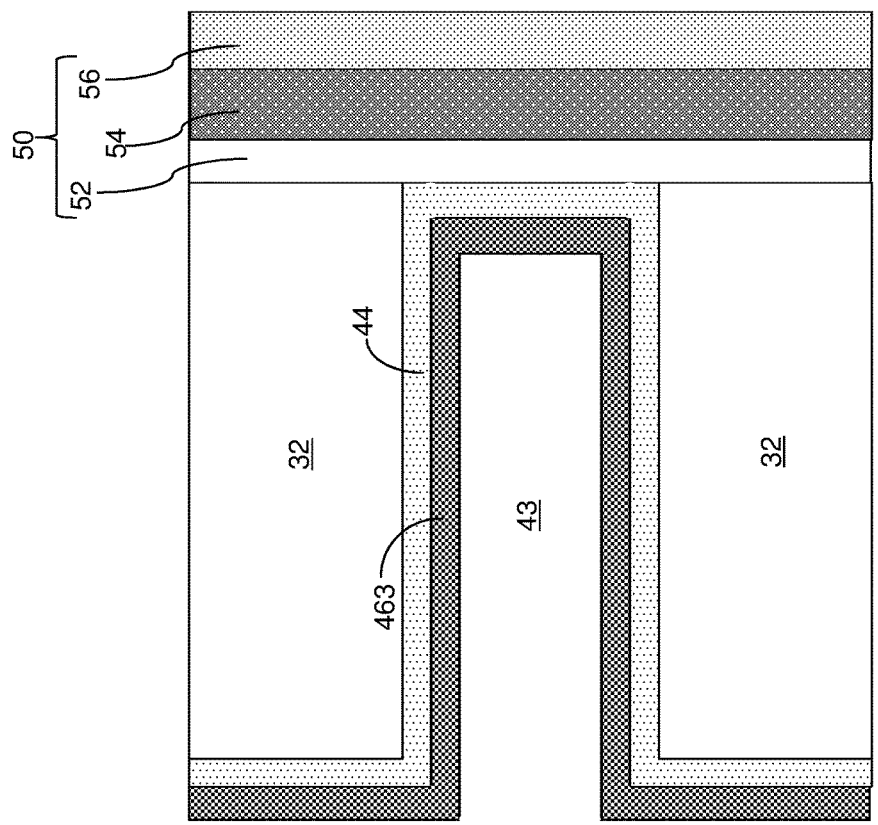

Referring to FIG. 9C, the exemplary structure can be disposed in a process chamber, into which a fluorine-free tungsten-containing precursor gas is subsequently flowed. In one embodiment, the tungsten-containing precursor gas includes molecules of a tungsten compound including chlorine atoms.

In one embodiment, the fluorine-free tungsten-containing precursor gas etches the amorphous titanium oxide layer 140 during tungsten deposition. For example, the fluorine-free tungsten-containing precursor gas can be, for example, tungsten hexachloride ($WCl_6$). Such a fluorine-free tungsten-containing precursor gas can etch the amorphous titanium oxide layer by forming a volatile material through reaction with titanium oxide. In case tungsten hexachloride is employed as the fluorine-free tungsten-containing precursor gas, volatile $TiCl_4$ gas can be generated through the following reaction: $WCl_6 + TiO_2 \rightarrow WO_2Cl_2 + TiCl_4$. The volatile $TiCl_4$ gas diffuses away from the exemplary structure into the exhaust of the process chamber, and $WO_2Cl_2$ accumulates on the surface of remaining portions of the amorphous titanium oxide layer 140. The chlorine atoms from the tungsten hexachloride diffuse through remaining portions of the amorphous titanium oxide layer 140 to convert a predominant portion of the amorphous titanium oxide layer 140 into volatile $TiCl_4$ gas and a layer of $WO_2Cl_2$. Residual titanium atoms can remain within the layer of $WO_2Cl_2$ such that the atomic ratio of titanium atoms to tungsten atoms is in a range of 0.0001-0.05:1. Generally, the amorphous titanium oxide layer 140 can be etched by the tungsten-containing precursor gas through formation of a volatile compound that is formed by combination of the chlorine atoms in the tungsten-containing precursor gas and titanium atoms in the amorphous titanium oxide layer 140. A residual tungsten-compound layer can be formed in lieu of the amorphous titanium oxide layer 140 on the surfaces of the backside blocking dielectric layer 44.

A reduction agent such as hydrogen gas or a hydride gas (for example, $SiH_4$, $Si_2H_6$, $CH_4$, or $B_2H_6$) can be subsequently flowed to reduce the material of the residual tungsten-compound layer into a fluorine-free tungsten liner 463. The reducing agent combines with non-tungsten elements within the residual tungsten-compound layer. For example, if the residual tungsten-compound layer includes $WO_2Cl_2$, hydrogen atoms of the reduction agent can combine with the oxygen atoms and chlorine atoms to form volatile gases (such as $H_2O$ and HCl). The remaining tungsten atoms form the fluorine-free tungsten liner 463. The fluorine-free tungsten liner 463 can be formed as a polycrystalline layer in which the tungsten atoms from the residual tungsten-compound layer gradually coalesce to form large grains having a thickness in a range from one atomic layer to 12 atomic layers (such as from two atomic layers to 6 atomic layers).

Because there is no template for formation of grain boundaries in the polycrystalline material of the fluorine-free tungsten liner 463, the grain size of the fluorine-free tungsten liner 463 is not limited by the dimensions of the backside recesses 43, but can be greater than the height of the backside recesses 43. In one embodiment, the average grain size of the polycrystalline tungsten in the fluorine-free tungsten liner 463 may be in a range from 20 nm to 100 nm.

Thus, a fluorine-free tungsten material in the form of the fluorine-free tungsten liner 463 can be deposited on the surfaces of the backside blocking dielectric layer 44. The fluorine-free tungsten liner 463 can be formed as a continuous material layer that covers the entire surface of the backside blocking dielectric layer 44. As used herein, a "fluorine-free" element refers to an element that includes fluorine at an atomic concentration less than 3 parts per million. Thus, the fluorine-free tungsten liner 463 includes fluorine at an atomic concentration less than 3 parts per million. The atomic concentration of fluorine in the fluorine-free tungsten liner 462 can be less than 2 parts per million, less than 1 parts per million, less than 0.3 parts per million, and/or less than 0.1 parts per million, such as 0 to 2 parts per million, for example 0.1 to 1 parts per million.

The fluorine-free tungsten liner 463 can include residual chlorine, which can be from the residual tungsten-compound layer. For example, residual chlorine from $WO_2Cl_2$ can remain in the fluorine-free tungsten liner 463 at an atomic concentration in a range from 3 parts per million to 0.1 percent (1,000 parts per million), such as from 10 parts per million to 300 parts per million.

The atomic concentration of residual titanium in the fluorine-free tungsten liner 463 can be greater than the atomic concentration of fluorine. In one embodiment, the atomic concentration of titanium in the fluorine-free tungsten liner 463 can be in a range from 3 parts per million to 0.1 percent (1,000 parts per million), such as from 10 parts per million to 300 parts per million. In one embodiment, the atomic concentration of titanium in the fluorine-free tungsten liner 463 can be in a range from ⅓ of the atomic concentration of chlorine in the fluorine-free tungsten liner 463 and three times the atomic concentration of chlorine in the fluorine-free tungsten liner 463. In one embodiment, a surface region of the fluorine-free tungsten liner 463 that contacts the backside blocking dielectric layer 44 includes titanium at an atomic concentration in a range from 0.1% to 5%.

Figure 9D:
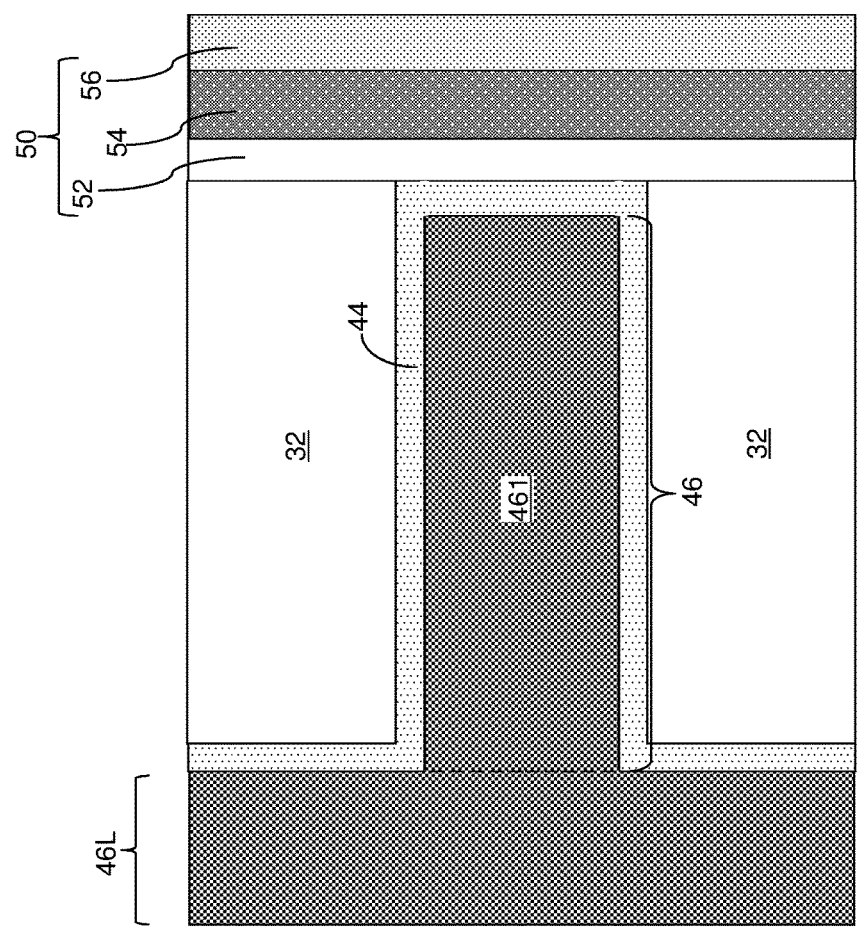
Figure 11:
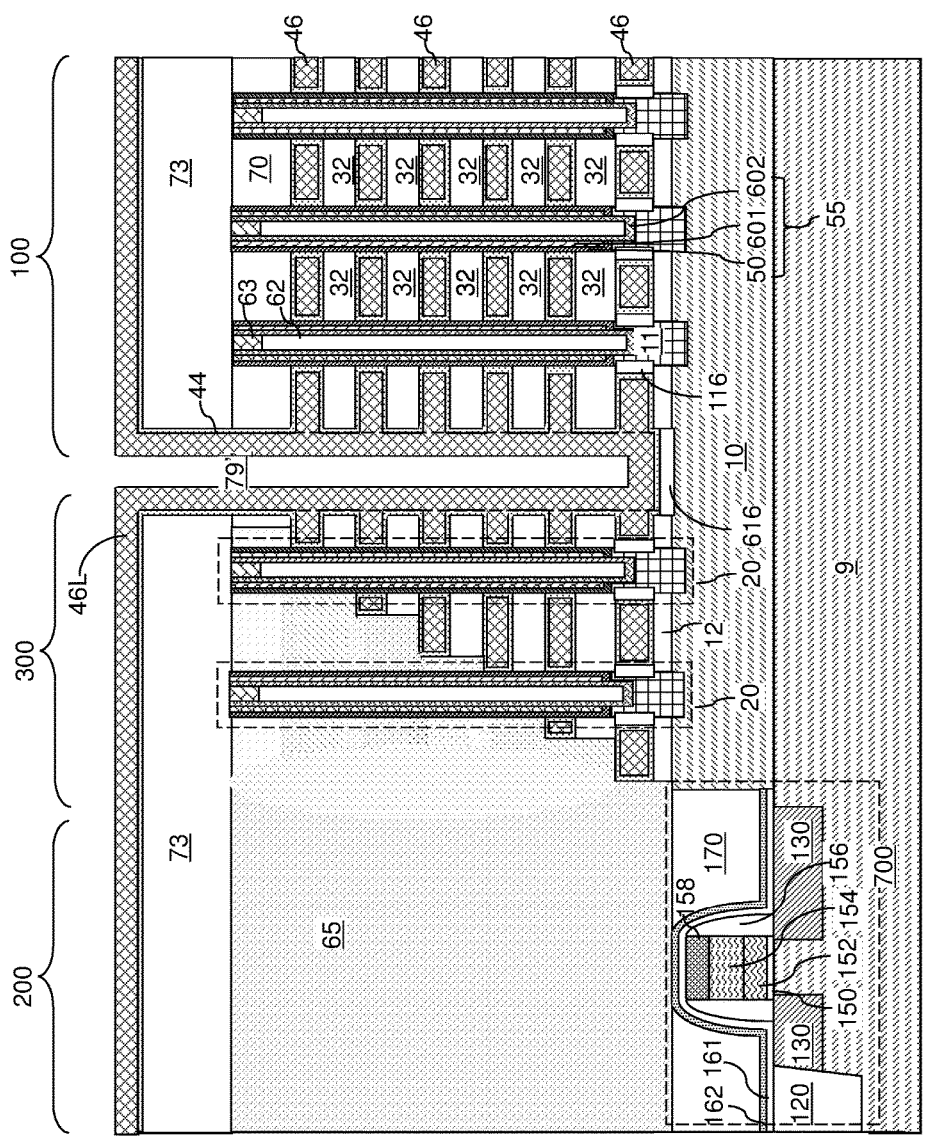
FIG. 11 is a schematic vertical cross-sectional view of the exemplary structure after formation of electrically conductive layers and a continuous conductive material layer according to an embodiment of the present disclosure.

Referring to FIGS. 9D and 11, additional fluorine-free tungsten material can be deposited on the fluorine-free tungsten liner 463. The additional fluorine-free tungsten material can be deposited by chemical vapor deposition (CVD) or atomic layer deposition (ALD). For example, a fluorine-free tungsten-containing precursor gas (such as $WCl_6$) and a reducing agent (such as $H_2$, $SiH_4$ or $B_2H_6$) can be concurrently flowed into a CVD process chamber which contains the exemplary structure to deposit the additional fluorine-free tungsten material onto the fluorine-free tungsten liner 463. The fluorine-free tungsten liner 463 is incorporated into a continuous fluorine-free tungsten layer 461 that fills the entire volume of the backside recesses 43 that are not filled with the backside blocking dielectric layer 44 and continuously extends along sidewalls of the backside trenches 79 and over the contact level dielectric layer 73.

The continuous fluorine-free tungsten layer 461 includes a plurality of electrically conductive layers 46 that are formed in the plurality of backside recesses 43 and a continuous tungsten cover layer 46L that are formed on the sidewalls of each backside contact trench 79 and over the contact level dielectric layer 73. The material of the fluorine-free tungsten liner 463 is incorporated into the continuous fluorine-free tungsten layer 461. Each electrically conductive layer 46 replaces a respective one of the sacrificial material layers 42, and includes a respective portion of the fluorine-free tungsten liner 463. Each electrically conductive layer 46 consists of a fluorine-free tungsten material. In one embodiment, a surface region of the fluorine-free tungsten layers 461 that contacts the backside blocking dielectric layer 44 includes titanium at an atomic concentration in a range from 0.1% to 5%.

The backside cavity 79' is present in the portion of each backside contact trench 79 that is not filled with the backside blocking dielectric layer and the continuous tungsten cover layer 46L. As shown in FIG. 11, the tubular dielectric spacer 116 laterally surrounds an epitaxial channel portion 11. A bottommost electrically conductive layer 46 laterally surrounds each tubular dielectric spacer 116 upon formation of the electrically conductive layers 46. A combination of the backside blocking dielectric layer 44 and the fluorine-free tungsten material can completely fill the entire volume of the backside recesses 43 as provided after the processing steps of FIG. 8.

The additional fluorine-free tungsten material that is deposited on the fluorine-free tungsten liner 463 can be deposited with the grain boundary structures provided in the fluorine-free tungsten liner 463. In other words, the deposition of the additional tungsten material uses the tungsten liner 463 as a template. Thus, the average grain size of the fluorine-free tungsten material of the electrically conductive layers 46 along the horizontal direction can be greater than the height of each backside cavity 43. Because the grain boundaries within each backside recess 43 meet at a horizontal seam within an electrically conductive layer 46 that fills the backside recess 43, the lateral dimensions of the grain boundaries of the fluorine-free tungsten material can be greater than the vertical dimensions of the grain boundaries of the fluorine-free tungsten material. The average grain size of the electrically conductive layers 46 can be 20 to 100 nm, such as 50 to 80 nm.

The large grains can reduce resistivity of the electrically conductive layers 46. The electrically conductive layers 46 including fluorine-free tungsten material according to the present disclosure can provide resistivity that is about one half of the resistivity of comparative exemplary electrically conductive layers in which tungsten is formed on polycrystalline TiN. By eliminating the polycrystalline metallic nitride barrier layer without introducing fluorine, the electrically conductive layers 46 of the present disclosure that are formed on amorphous titanium oxide layer 140 can provide lower resistivity for the electrically conductive layers 46 while preventing structural damage that can be caused by fluorine diffusion (such as etching of aluminum oxide backside blocking dielectric by fluorine). The resistivity of the electrically conductive layers can be less than 25 microOhm-cm, such as 20 to 23 microOhm-cm.

Figure 10A:
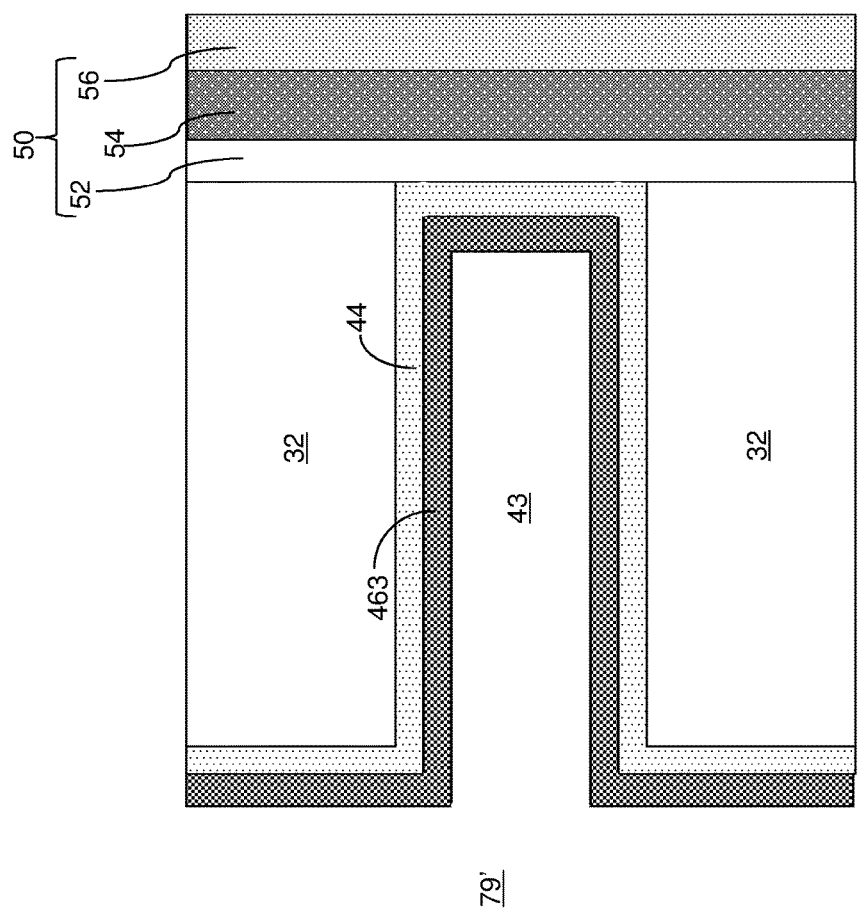
FIGS. 10A and 10B are sequential vertical cross-sectional views of a region of the exemplary structure during formation of an electrically conductive layer according to a second embodiment of the present disclosure.

Referring to FIG. 10A, the exemplary structure at the processing steps of FIG. 9C can be employed to form electrically conductive layers 46 according to a second embodiment of the present disclosure. The second exemplary structure of FIG. 10A can be the same as the first exemplary structure of FIG. 9C, and can be formed by the same processing steps. In one embodiment, a surface region of the fluorine-free tungsten liner 463 that contacts the backside blocking dielectric layer 44 includes titanium at an atomic concentration in a range from 0.1% to 5%.

Figure 10B:
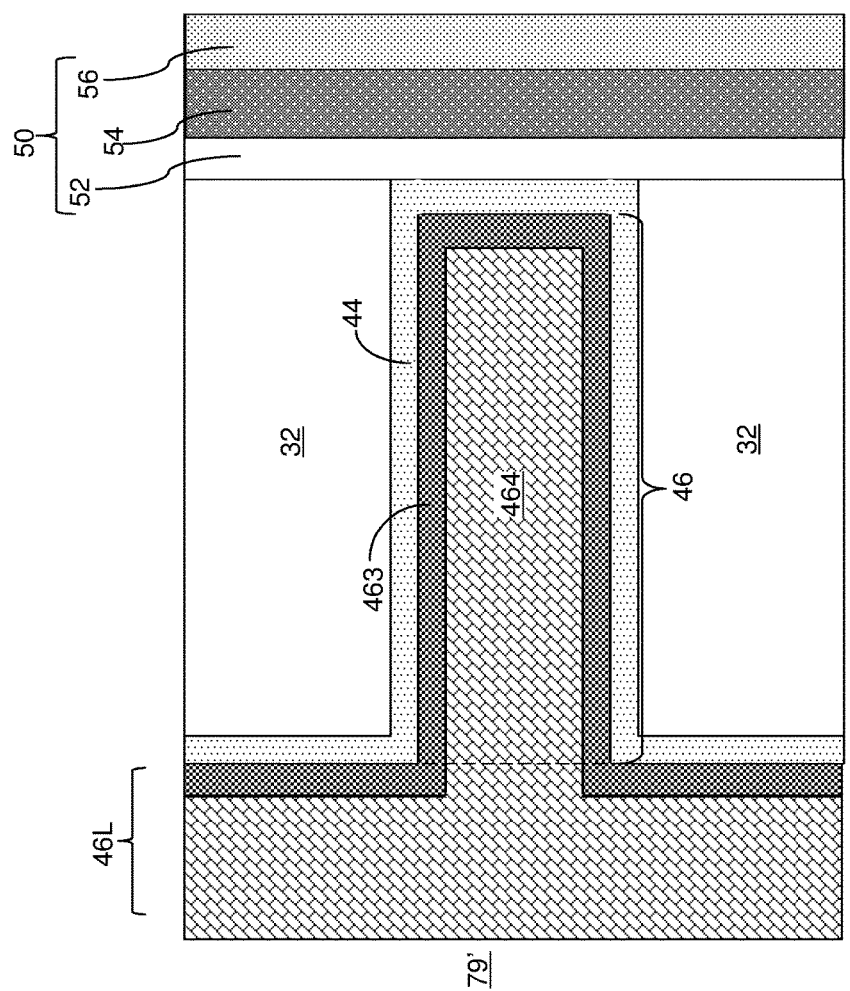

Referring to FIGS. 10B and 11, the cavities within the backside recesses 43 can be filled with a metallic material. A metallic material layer 464 is formed by deposition of the metallic material on the fluorine-free tungsten liner 463.

In one embodiment, the metallic material can be tungsten deposited employing a fluorine-containing tungsten precursor gas. For example, $WF_6$ and a reducing agent such as $H_2$, $SiH_4$, or $B_2H_6$ can be concurrently flowed into a CVD process chamber which contains the exemplary structure to deposit a fluorine-containing tungsten material onto the fluorine-free tungsten liner 463. In this case, the metallic material layer 464 includes fluorine-containing tungsten. The fluorine-containing tungsten of the metallic material layer 464 can include fluorine at an atomic concentration in a range from 3 parts per million to 1,000 parts per million, such as from 10 parts per million to 100 parts per million. In case $SiH_4$ or $Si_2H_6$ is employed as the reducing agent, the metallic material layer 464 can include silicon at an atomic concentration in a range from 3 parts per million to 1,000 parts per million, such as from 10 parts per million to 100 parts per million. In case $B_2H_6$ is employed as the reducing agent, the metallic material layer 464 can include boron at an atomic concentration in a range from 3 parts per million to 1,000 parts per million, such as from 10 parts per million to 100 parts per million.

The metallic material layer 464 including fluorine-containing tungsten fills the remaining volume of the backside recesses 43 that are not filled with the backside blocking dielectric layer 44 and the fluorine-free tungsten liner 463, and continuously extends along sidewalls of the backside trenches 79 and over the contact level dielectric layer 73.

The fluorine-free tungsten liner 463 acts as both a template and as a fluorine diffusion barrier during the deposition of the metallic material layer 464. Thus the fluorine-free tungsten liner 463 prevents or reduces fluorine diffusion into the backside blocking dielectric layer 44.

The layer stack of the metallic material layer 464 and the fluorine-free tungsten liner 463 includes a plurality of electrically conductive layers 46 are formed in the plurality of backside recesses 43 and a continuous tungsten cover layer 46L that are located on the sidewalls of each backside contact trench 79 and over the contact level dielectric layer 73. Each electrically conductive layer 46 replaces a respective one of the sacrificial material layers 42, and includes a respective portion of the metallic material layer 464 including fluorine-containing tungsten and a respective portion of the fluorine-free tungsten liner 463.

A backside cavity 79' is present in the portion of each backside contact trench 79 that is not filled with the backside blocking dielectric layer and the continuous tungsten cover layer 46L. A tubular dielectric spacer 116 laterally surrounds an epitaxial channel portion 11. A bottommost electrically conductive layer 46 laterally surrounds each tubular dielectric spacer 116 upon formation of the electrically conductive layers 46. A combination of the backside blocking dielectric layer 44, the metallic material layer 464, and the fluorine-free tungsten liner 463 can completely fill the entire volume of the backside recesses 43 as provided after the processing steps of FIG. 8.

The fluorine-containing tungsten material that is deposited on the fluorine-free tungsten liner 463 can be deposited with the grain boundary structures provided in the fluorine-free tungsten liner 463. Thus, the average grain size of the fluorine-containing tungsten material of the electrically conductive layers 46 along the horizontal direction can be greater than the height of each backside cavity 43. Because the grain boundaries within each backside recess 43 meet at a horizontal seam within an electrically conductive layer 46 that fills the backside recess 43, the lateral dimensions of the grain boundaries of the fluorine-containing tungsten material can be greater than the vertical dimensions of the grain boundaries of the fluorine-containing tungsten material.

Such large grains can reduce resistivity of the electrically conductive layers 46. As in the case of the electrically conductive layers 46 of the first embodiment illustrated in FIGS. 9D and 11, the electrically conducive layers 46 of the second embodiment as illustrated in FIGS. 10B and 11 can provide lower electrical resistance than prior art electrically conductive layers employing a combination of a metallic nitride liner (such as a TiN liner) and a tungsten fill layer. The average grain size of the electrically conductive layers 46 can be 20 to 100 nm, such as 50 to 80 nm and the resistivity of the electrically conductive layers 46 can be can be less than 25 microOhm-cm, such as 20 to 23 microOhm-cm.

Figure 12:
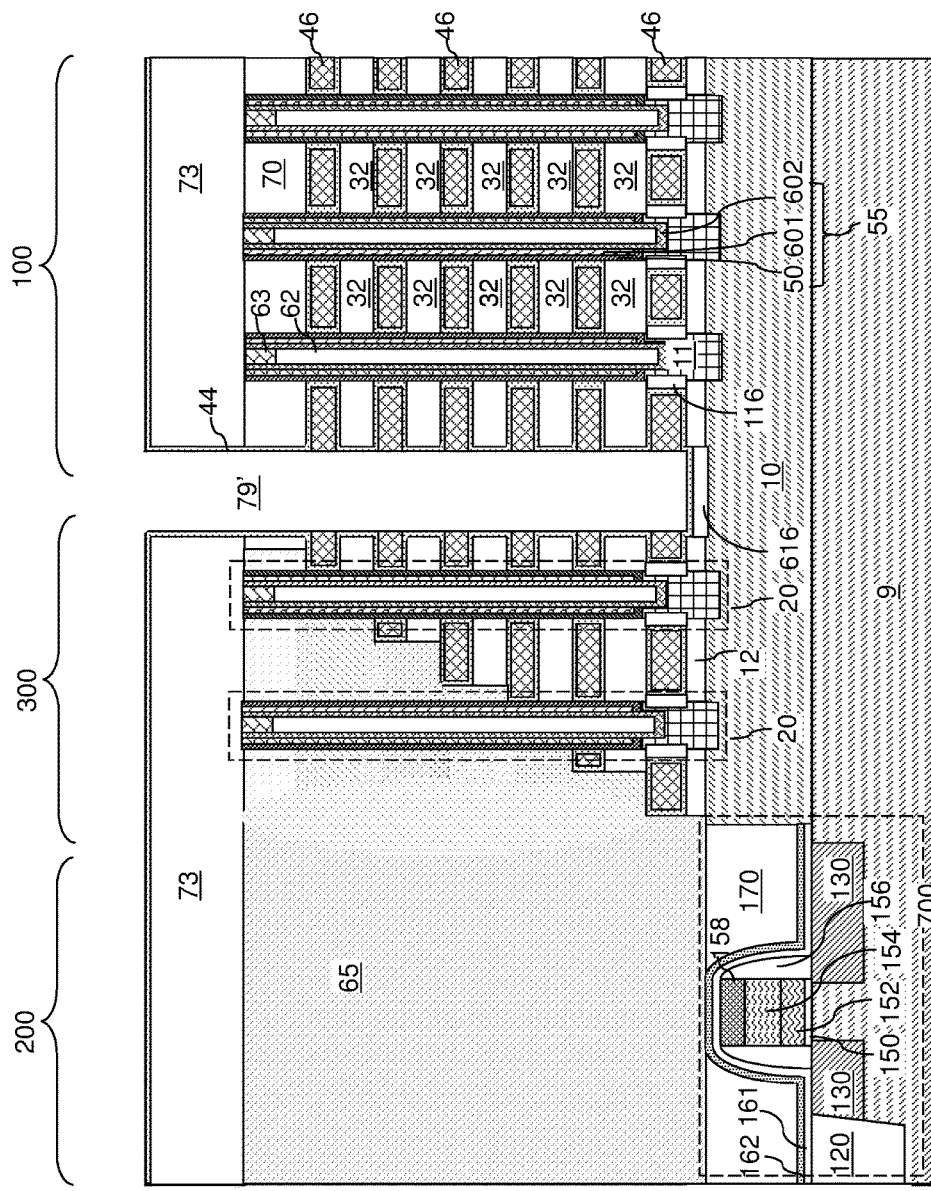
FIG. 12 is a schematic vertical cross-sectional view of the exemplary structure after removal of a deposited conductive material from within the backside trench according to an embodiment of the present disclosure.

Referring to FIG. 12, the deposited metallic material of the continuous electrically conductive material layer 46L, as formed at the processing steps of FIG. 9D or 10B, is etched back from the sidewalls of each backside contact trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside contact trench 79. The base insulating layer 12 can be vertically spaced from the backside contact trench 79 by the horizontal portion of the backside blocking dielectric layer 44.

In another embodiment, the removal of the continuous electrically conductive material layer 46L may not be selective to the material of the backside blocking dielectric layer 44 or, the backside blocking dielectric layer 44 may not be employed. In this case, a top surface and/or sidewall surface, of the base insulating layer 12 can be physically exposed at the bottom of the backside contact trench 79 depending on whether the base insulating layer 12 is not removed or partially removed during removal of the continuous electrically conductive material layer 46L. In one embodiment, a top surface of the cap gate dielectric layer 616 can be physically exposed at the bottom of the backside contact trench 79 after removal of the continuous electrically conductive material layer 46L. A backside cavity 79' is present within each backside contact trench 79.

Figure 13A:
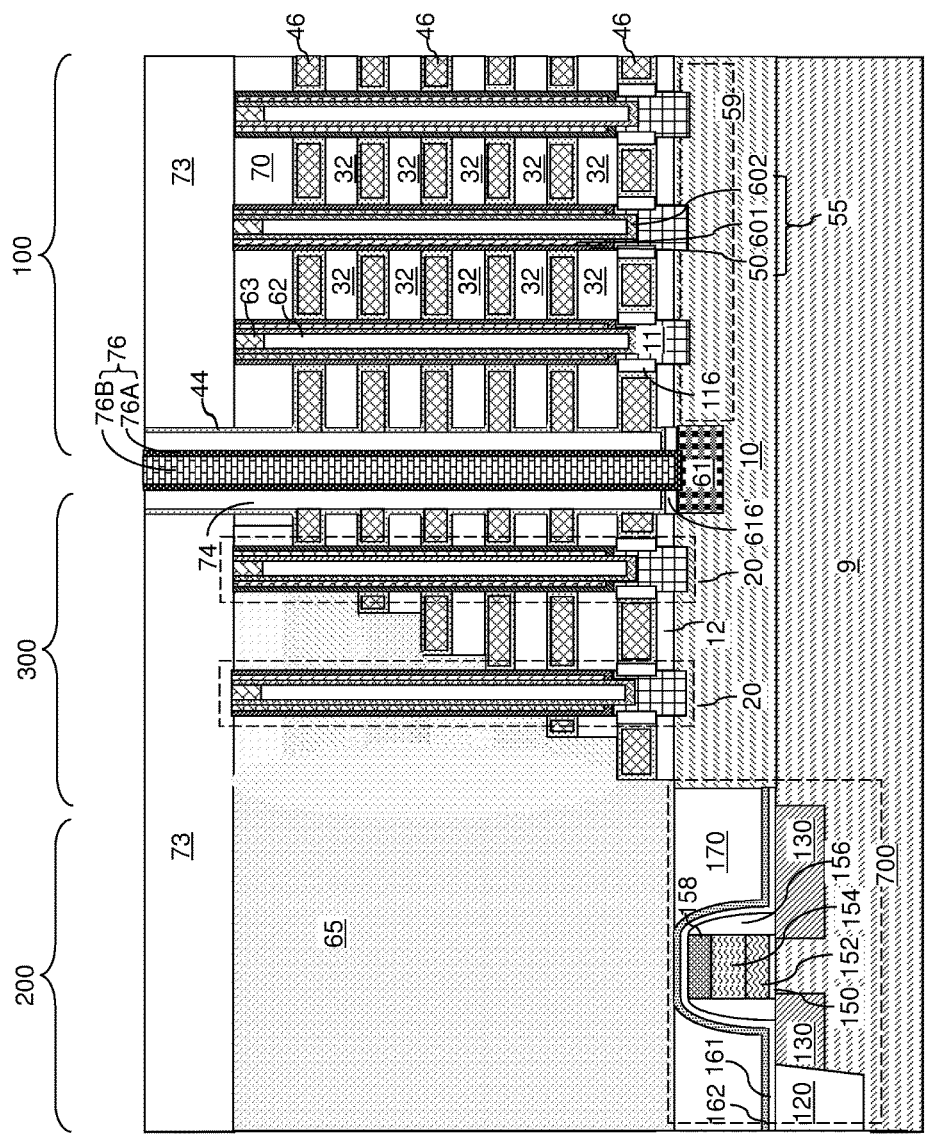
FIG. 13A is a schematic vertical cross-sectional view of the exemplary structure after formation of an insulating spacer and a backside contact structure according to first and second embodiments of the present disclosure.
Figure 13B:
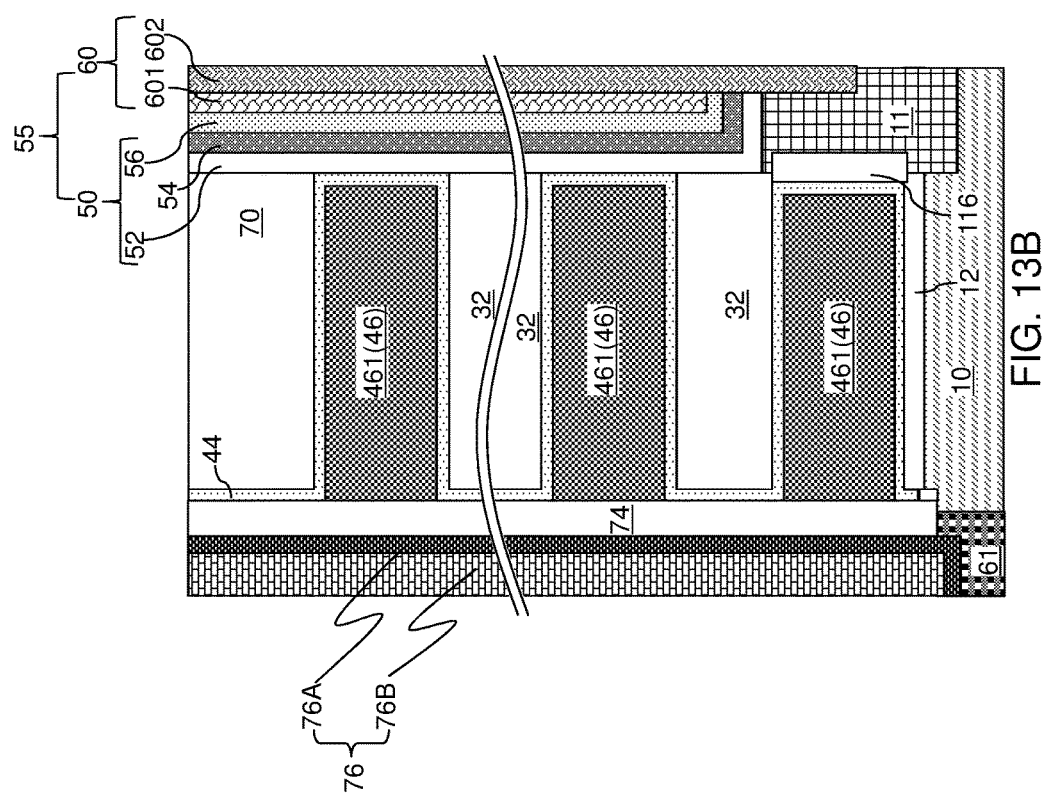
FIG. 13B is a magnified view of a region of the exemplary structure of FIG. 13A according to the first embodiment of the present disclosure.

Referring to FIGS. 13A-13C, an insulating material layer can be formed in the at least one backside contact trench 79 and over the contact level dielectric layer 73 by a conformal deposition process. FIG. 13B illustrates the exemplary structure according to the first embodiment, i.e., as derived from the exemplary structure of FIG. 9D. FIG. 13C illustrates the exemplary structure according to the second embodiment, i.e., as derived from the exemplary structure of FIG. 10B. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside contact trench 79. Each remaining portion of the insulating material layer constitutes an insulating spacer 74. A backside cavity 79' is present within a volume surrounded by each insulating spacer 74.

The anisotropic etch process can continue with, or without, a change in the etch chemistry to remove portions of the optional backside blocking dielectric layer 44 and the planar dielectric portion 616 that underlies the opening through the insulating spacer 74. An opening is formed though the planar dielectric portion 616 underneath each backside cavity 79', thereby vertically extending the backside cavity 79'. A top surface of the semiconductor material layer 10 can be physically exposed at the bottom of each backside contact trench 79. The remaining portion of each planar dielectric portion 616 is herein referred to as an annular dielectric portion 616', which can include a dielectric oxide of the semiconductor material of the semiconductor material layer 10, have a uniform thickness, and an opening therethrough.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of epitaxial channel portions 11 constitutes a horizontal semiconductor channel 59 for a plurality of field effect transistors. The horizontal semiconductor channel 59 is connected to multiple vertical semiconductor channels 60 through respective epitaxial channel portions 11. The horizontal semiconductor channel 59 contacts the source region 61 and the plurality of epitaxial channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A contact via structure 76 can be formed within each cavity 79'. Each contact via structure 76 can fill a respective cavity 79'. The contact via structures 76 can be formed by depositing at least one conductive material in the remaining unfilled volume (i.e., the backside cavity 79') of the backside contact trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside contact trenches 79 constitutes a backside contact via structure 76. The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44. Each metallic barrier layer (as embodied as the oxygen-containing titanium compound layers 46A) contacts an outer sidewall of an insulating spacer 74.

Figure 14A:
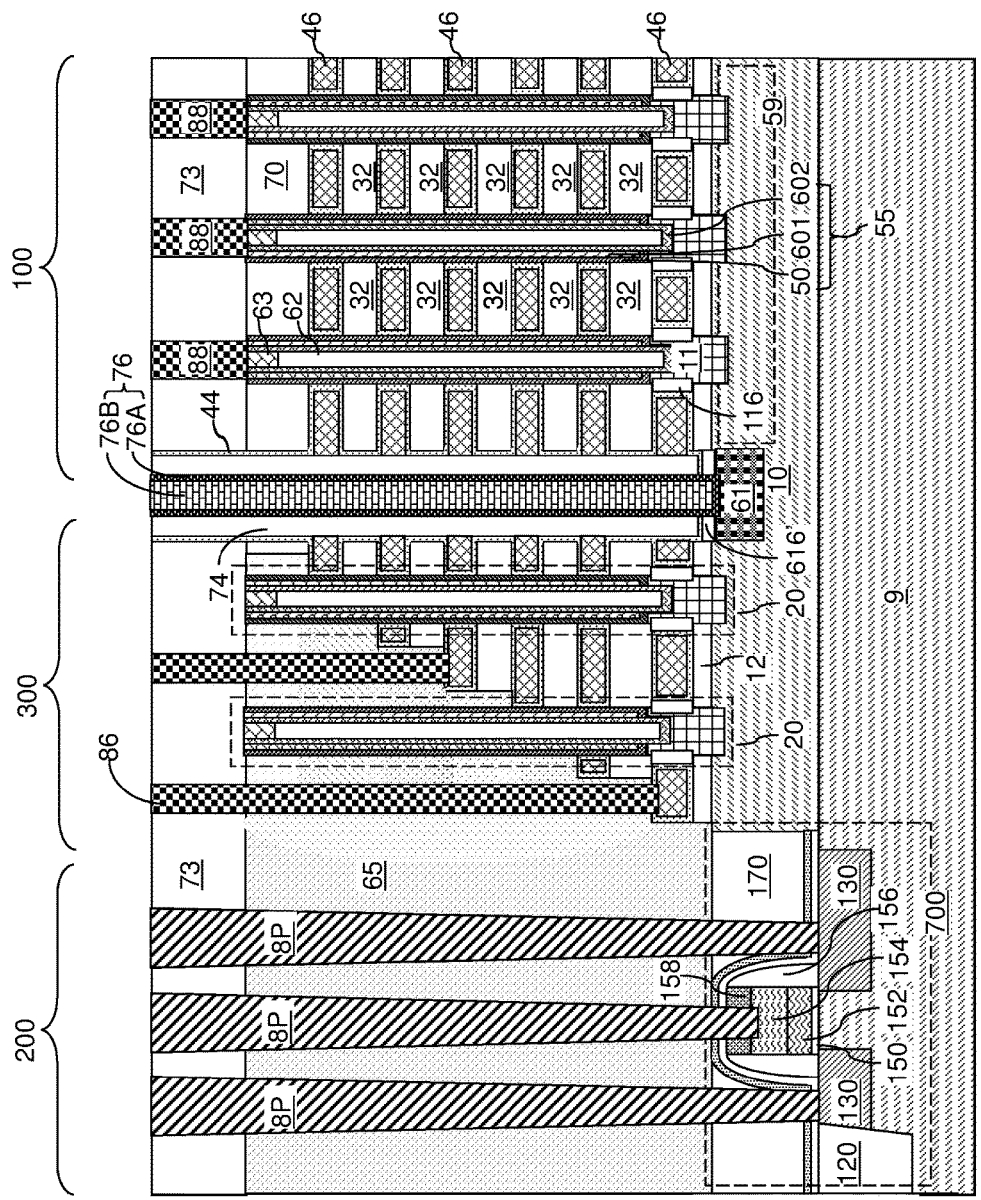
FIG. 14A is a schematic vertical cross-sectional view of the exemplary structure after formation of additional contact via structures according to an embodiment of the present disclosure.
Figure 14B:
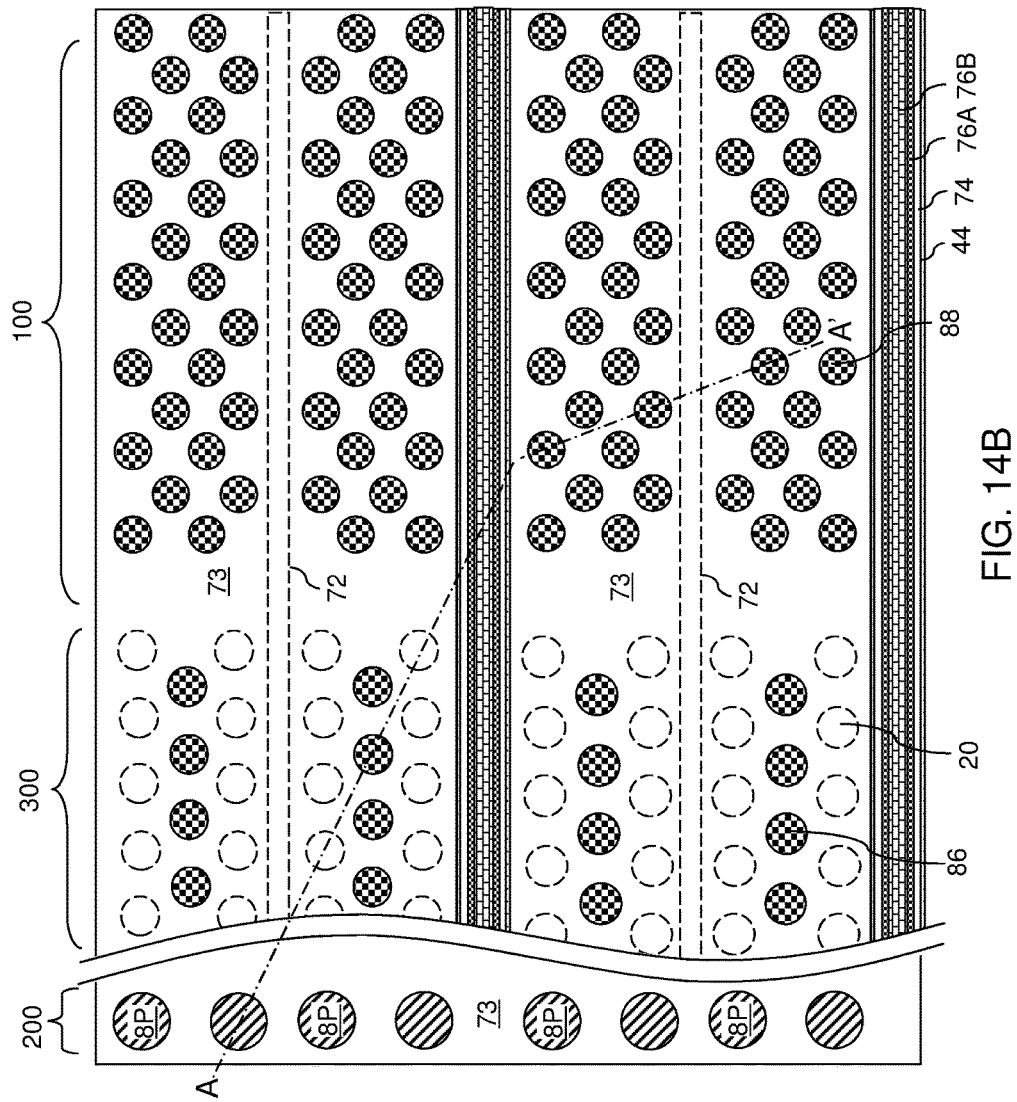
FIG. 14B is a top-down view of the exemplary structure of FIG. 14A. The plane A-A' is the plane of the vertical cross-section of FIG. 14A.

Referring to FIGS. 14A and 14B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Referring to all drawings of the present disclosure and according to various embodiments of the present disclosure, a method of forming a three-dimensional memory device includes forming an alternating stack of insulating layers 32 and sacrificial material layers 42 over a substrate (9, 10), forming memory stack structures 55 through the alternating stack, such that each of the memory stack structures 55 includes a memory film 50 and a vertical semiconductor channel 60, forming backside recesses 43 by removing the sacrificial material layers 42 selective to the insulating layers 32 and the memory stack structures 55, forming a backside blocking dielectric layer 44 in the backside recesses 43, forming an amorphous titanium oxide layer 140 on surfaces of the backside blocking dielectric layer 44 in the backside recesses, and forming tungsten word lines 46 in the backside recesses using a fluorine-free tungsten-containing precursor gas.

In one embodiment, the amorphous titanium oxide layer 140 consists essentially of $TiO_x$, where x is in a range from 1.50 to 2.05, and the fluorine-free tungsten-containing precursor gas, such as $WCl_6$, etches the amorphous titanium oxide layer 140 such that the tungsten word lines 46 are deposited on surfaces of the backside blocking dielectric layer 44. The amorphous titanium oxide layer 140 can be completely removed by the fluorine-free tungsten-containing precursor gas during deposition of the tungsten word lines 46 by formation of a volatile compound that is formed by combination of chlorine atoms in the fluorine-free tungsten-containing precursor gas and titanium atoms in the amorphous titanium oxide layer 140.

In one embodiment, the backside blocking dielectric layer 44 comprises an aluminum oxide layer that is deposited by atomic layer deposition. The tungsten word lines 46 comprise chlorine at an atomic concentration in a range from 3 parts per million to 1,000 parts per million.

In one embodiment shown in FIGS. 9A-9D, the entire tungsten word lines 46 are formed using a fluorine-free tungsten-containing precursor gas, and the tungsten word lines 46 comprise fluorine at an atomic concentration of less than 3 parts per million.

In another embodiment shown in FIGS. 10A and 10B, forming the tungsten word lines 46 in the backside recesses 43 comprises forming a fluorine-free tungsten liner 463 using the fluorine-free tungsten-containing precursor gas, followed by filling cavities within the backside recesses 43 after formation of the fluorine-free tungsten liner 463 by deposition of tungsten metallic material portions 464 using $WF_6$ tungsten precursor gas.

Referring to all drawings of the present disclosure and according to various embodiments of the present disclosure, a three-dimensional memory device is provided. The three-dimensional memory device comprises: an alternating stack of insulating layers 32 and electrically conductive layers 46 located over a substrate (9, 10), memory stack structures 55 extending through the alternating stack (32, 46), wherein each of the memory stack structures 55 comprises a memory film 50 and a vertical semiconductor channel 60, and a backside blocking dielectric layer 44 located between each vertically neighboring pair of an insulating layer 32 and an electrically conductive layer 46. Each of the electrically conductive layers 46 comprises a fluorine-free tungsten material portion (461 or 463) in contact with surfaces of the backside blocking dielectric layer 44.

In one embodiment, a surface region of the fluorine-free tungsten material portions (461 or 463) that contacts the backside blocking dielectric layer 44 includes titanium at an atomic concentration in a range from 0.1% to 5%. In one embodiment, the fluorine-free tungsten material portions (461 or 463) include chlorine at an atomic concentration in a range from 10 parts per million to 1,000 parts per million and fluorine at an atomic concentration of less than 3 parts per million.

In one embodiment, the backside blocking dielectric layer 44 comprises an aluminum oxide layer. In one embodiment, each of the electrically conductive layers 46 consists of only the fluorine-free tungsten material portion 461 as illustrated in FIG. 13B. In another embodiment, each of the electrically conductive layers 46 comprise a fluorine-free tungsten liner 463 which comprises the fluorine-free tungsten material portion, and a metallic material portion 464 embedded in the fluorine-free tungsten liner 463 and having a composition different from the fluorine-free tungsten liner 463 as illustrated in FIG. 13C. In one embodiment, the metallic material portion 464 can include fluorine-containing tungsten, and differs in composition from the fluorine-free tungsten liner 463 by presence of fluorine and absence of chlorine. In one embodiment, the metallic material portion 464 can be a tungsten portion including fluorine at an atomic concentration in a range from 10 parts per million to 1,000 parts per million.

In one embodiment, each of the memory stack structures 55 is located within a respective memory opening 49 that extends through the alternating stack (32, 46); the memory film 50 comprises, from outside to inside, a blocking dielectric layer 52; a vertical stack of charge storage elements (such as a charge storage layer 54), and a tunneling dielectric layer 56; and an outer sidewall of the blocking dielectric layer 52 contacts the backside blocking dielectric layer 44.

In one embodiment, the alternating stack (32, 46) comprises a terrace region in which each electrically conductive layer 46 other than a topmost electrically conductive layer 46 within the alternating stack (32, 46) laterally extends farther than an overlying electrically conductive layer 46 within the alternating stack (32, 46); the terrace region includes stepped surfaces of the alternating stack (32, 46) that continuously extend from a bottommost layer within the alternating stack (32, 46) to a topmost layer within the alternating stack (32, 46); a retro-stepped dielectric material portion 65 is located over the stepped surfaces in the terrace region; the three-dimensional memory device further comprises support pillar structures 20 extending through the retro-stepped dielectric material portion 65 and a portion of the alternating stack (32, 46) in the terrace region; and each of the support pillar structures 20 includes a dummy memory film having a same set of component layers as the memory film 50.

The exemplary structures of the present disclosure can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) comprises the vertical semiconductor channel 60 which extends substantially perpendicular to a top surface of the substrate (9, 10); and the memory film 50 comprises a plurality of charge storage elements comprising portions of the charge storage layer 54 located adjacent to a respective one of the plurality of word lines 46.

The amorphous titanium oxide layer 140 of the embodiments of the present disclosure is a sacrificial material layer that is employed as a template to increase the grain size of tungsten word lines 46. Because the amorphous titanium oxide layer 140 is removed during word line deposition, the amorphous titanium oxide layer 140 does not occupy any volume in a completed device. However, the amorphous titanium oxide layer 140 provides an amorphous template that enables formation of large grains in the fluorine-free tungsten liner 463, which may remain as a discrete structure or may be incorporated into a fluorine-free tungsten layer 461 (i.e., into word lines 46 which are entirely fluorine-free). Thus, the word lines 46 have a lower resistivity compared to prior art word lines containing a polycrystalline TiN barrier, thereby reducing the RC delay of the word lines. In addition, absence of fluorine in the surface portions of the word lines 46 that contact the backside blocking dielectric layer 44 provides protection for the backside blocking dielectric layers 44 from attack by fluorine atoms.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:
   forming an alternating stack of insulating layers and sacrificial material layers over a substrate;
   forming memory stack structures through the alternating stack, wherein each of the memory stack structures comprises a memory film and a vertical semiconductor channel;
   forming backside recesses by removing the sacrificial material layers selective to the insulating layers and the memory stack structures;
   forming a backside blocking dielectric layer in the backside recesses;
   forming an amorphous titanium oxide layer on surfaces of the backside blocking dielectric layer in the backside recesses; and
   forming tungsten word lines in the backside recesses using a fluorine-free tungsten-containing precursor gas.

2. The method of claim 1, wherein the amorphous titanium oxide layer consists essentially of $TiO_x$, where x is in a range from 1.50 to 2.05.

3. The method of claim 1, wherein the fluorine-free tungsten-containing precursor gas etches the amorphous titanium oxide layer such that the tungsten word lines are deposited on surfaces of the backside blocking dielectric layer.

4. The method of claim 3, wherein the fluorine-free tungsten-containing precursor gas is $WCl_6$.

5. The method of claim 3, wherein the amorphous titanium oxide layer is completely removed by the fluorine-free tungsten-containing precursor gas during deposition of the tungsten word lines by formation of a volatile compound that is formed by combination of chlorine atoms in the fluorine-free tungsten-containing precursor gas and titanium atoms in the amorphous titanium oxide layer.

6. The method of claim 1, wherein the backside blocking dielectric layer comprises an aluminum oxide layer that is deposited by atomic layer deposition.

7. The method of claim 1, wherein the tungsten word lines comprise chlorine at an atomic concentration in a range from 3 parts per million to 1,000 parts per million.

8. The method of claim 7, wherein the entire tungsten word lines are formed using a fluorine-free tungsten-containing precursor gas, and the tungsten word lines comprise fluorine at an atomic concentration of less than 3 parts per million.

9. The method of claim 1, wherein forming the tungsten word lines in the backside recesses comprises:
   forming a fluorine-free tungsten liner using the fluorine-free tungsten-containing precursor gas; and
   filling cavities within the backside recesses after formation of the fluorine-free tungsten liner by deposition of tungsten using $WF_6$ tungsten precursor gas.

10. The method of claim 1, further comprising forming memory openings through the alternating stack of insulating layers and electrically conductive layers, wherein:

the memory stack structures are formed in the memory openings;

the memory film comprises, from outside to inside, a blocking dielectric layer; a vertical stack of charge storage elements, and a tunneling dielectric layer; and the backside blocking dielectric layer is formed directly on an outer sidewall of the blocking dielectric layer.

11. A three-dimensional memory device, comprising:
an alternating stack of insulating layers and electrically conductive layers located over a substrate;
memory stack structures extending through the alternating stack, wherein each of the memory stack structures comprises a memory film and a vertical semiconductor channel; and
a backside blocking dielectric layer is located between each vertically neighboring pair of an insulating layer and an electrically conductive layer;
wherein each of the electrically conductive layers comprises a fluorine-free tungsten material portion in contact with surfaces of the backside blocking dielectric layer; and
wherein a surface region of the fluorine-free tungsten material portions that contacts the backside blocking dielectric layer includes titanium at an atomic concentration in a range from 0.1% to 5%.

12. A three-dimensional memory device, comprising:
an alternating stack of insulating layers and electrically conductive layers located over a substrate;
memory stack structures extending through the alternating stack, wherein each of the memory stack structures comprises a memory film and a vertical semiconductor channel; and
a backside blocking dielectric layer is located between each vertically neighboring pair of an insulating layer and an electrically conductive layer;
wherein each of the electrically conductive layers comprises a fluorine-free tungsten material portion in contact with surfaces of the backside blocking dielectric layer; and
wherein the fluorine-free tungsten material portions include chlorine at an atomic concentration in a range from 3 parts per million to 1,000 parts per million and fluorine at an atomic concentration of less than 3 parts per million.

13. The three-dimensional memory device of claim 11, wherein the backside blocking dielectric layer comprises an aluminum oxide layer.

14. The three-dimensional memory device of claim 11, wherein each of the electrically conductive layers consists of the fluorine-free tungsten material portion.

15. A three-dimensional memory device, comprising:
an alternating stack of insulating layers and electrically conductive layers located over a substrate;
memory stack structures extending through the alternating stack, wherein each of the memory stack structures comprises a memory film and a vertical semiconductor channel; and
a backside blocking dielectric layer is located between each vertically neighboring pair of an insulating layer and an electrically conductive layer;
wherein each of the electrically conductive layers comprises a fluorine-free tungsten material portion in contact with surfaces of the backside blocking dielectric layer; and
wherein each of the electrically conductive layers comprise:
a fluorine-free tungsten liner comprising the fluorine-free tungsten material portion; and
a metallic material portion embedded in the fluorine-free tungsten liner and having a composition different from the fluorine-free tungsten liner.

16. The three-dimensional memory device of claim 15, wherein the metallic material portion is a tungsten portion including fluorine at an atomic concentration in a range from 3 parts per million to 1,000 parts per million.

17. The three-dimensional memory device of claim 11, wherein:
each of the memory stack structures is located within a respective memory opening that extends through the alternating stack;
the memory film comprises, from outside to inside, a blocking dielectric layer; a vertical stack of charge storage elements, and a tunneling dielectric layer; and
an outer sidewall of the blocking dielectric layer contacts the backside blocking dielectric layer.

18. The three-dimensional memory device of claim 11, wherein:
the three-dimensional memory array comprises a monolithic three-dimensional NAND memory device;
the electrically conductive layers comprise or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
the array of monolithic three-dimensional NAND strings comprises:
a plurality of semiconductor channels, wherein at least one end portion of each of the plurality of semiconductor channels comprises the vertical semiconductor channel which extends substantially perpendicular to a top surface of the substrate, and
the memory film comprises a plurality of charge storage elements, each charge storage element located adjacent to a respective one of the plurality of control gate electrodes.

* * * * *